United States Patent
Harada et al.

(10) Patent No.: US 8,946,693 B2
(45) Date of Patent: Feb. 3, 2015

(54) ORGANIC EL ELEMENT, DISPLAY DEVICE, AND LIGHT-EMITTING DEVICE

(71) Applicant: Panasonic Corporation, Osaka (JP)

(72) Inventors: Kenji Harada, Hyogo (JP); Seiji Nishiyama, Osaka (JP); Takahiro Komatsu, Osaka (JP); Takayuki Takeuchi, Hyogo (JP); Satoru Ohuchi, Osaka (JP); Hirofumi Fujita, Osaka (JP); Shinya Fujimura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/742,575

(22) Filed: Jan. 16, 2013

(65) Prior Publication Data

US 2013/0126846 A1 May 23, 2013

Related U.S. Application Data

(63) Continuation of application No. PCT/JP2010/004954, filed on Aug. 6, 2010.

(51) Int. Cl.
| | |
|---|---|
| *H01L 51/50* | (2006.01) |
| *H05B 33/02* | (2006.01) |
| *H01L 27/32* | (2006.01) |

(52) U.S. Cl.
CPC ............ *H01L 51/5088* (2013.01); *H05B 33/02* (2013.01); *H01L 27/3246* (2013.01); *H01L 27/3283* (2013.01)
USPC ......................................................... 257/40

(58) Field of Classification Search
CPC . H01L 51/72; H01L 51/0036; H01L 51/0545; H01L 51/5088
USPC .............................................. 257/40, 43, 72
See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| CN | 1426894 | 7/2003 |
| EP | 2175504 | 4/2010 |

(Continued)

OTHER PUBLICATIONS

Meyer et al., Charge generation layers comprising transition metal-oxide/organic interfaces: Electronic structure and charge generation mechanism, May 2010, Applied Physics Letters, 96, 193302, pp. 1-3.*

(Continued)

*Primary Examiner* — Matthew W Such
*Assistant Examiner* — Warren H Kilpatrick
(74) *Attorney, Agent, or Firm* — Greenblum & Bernstein, P.L.C.

(57) ABSTRACT

An organic EL element comprising: an anode; a cathode; banks; a functional layer between the anode and the cathode, the functional layer including one or more sublayers including a light-emitting sublayer, the light-emitting sublayer defined by the banks and containing an organic material; and a hole injection layer between the anode and the functional layer, wherein the hole injection layer comprises tungsten oxide. An Ultraviolet Photoelectron Spectroscopy (UPS) spectrum, obtained from a UPS measurement, has a protrusion appearing near a Fermi surface and within a region corresponding to a binding energy range lower than a top of a valence band. The tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83.

20 Claims, 25 Drawing Sheets

(56) References Cited

U.S. PATENT DOCUMENTS

| | | | |
|---|---|---|---|
| 5,688,551 | A | 11/1997 | Littman et al. |
| 6,132,280 | A | 10/2000 | Tanabe et al. |
| 6,284,393 | B1 | 9/2001 | Hosokawa et al. |
| 6,309,801 | B1 | 10/2001 | Meijer et al. |
| 7,785,718 | B2 | 8/2010 | Yatsunami et al. |
| 2002/0051894 | A1 | 5/2002 | Yoshikawa |
| 2002/0158835 | A1 | 10/2002 | Kobayashi et al. |
| 2003/0137242 | A1 | 7/2003 | Seki |
| 2004/0075385 | A1 | 4/2004 | Tao |
| 2004/0178414 | A1 | 9/2004 | Frey et al. |
| 2005/0064633 | A1 | 3/2005 | Mikoshiba |
| 2005/0073243 | A1 | 4/2005 | Yamazaki et al. |
| 2005/0170208 | A1 | 8/2005 | Yatsunami et al. |
| 2005/0208206 | A1 | 9/2005 | Yoshikawa |
| 2005/0266763 | A1* | 12/2005 | Kimura et al. ............. 445/24 |
| 2006/0008931 | A1 | 1/2006 | Lee et al. |
| 2006/0181583 | A1 | 8/2006 | Usuda |
| 2006/0204788 | A1 | 9/2006 | Yoshikawa |
| 2006/0243377 | A1 | 11/2006 | Matsuo et al. |
| 2006/0284166 | A1 | 12/2006 | Chua et al. |
| 2007/0029929 | A1 | 2/2007 | Nakamura et al. |
| 2007/0034864 | A1 | 2/2007 | Liu |
| 2007/0092981 | A1 | 4/2007 | Jung et al. |
| 2007/0148333 | A1 | 6/2007 | Morimoto |
| 2007/0172978 | A1 | 7/2007 | Chua et al. |
| 2007/0241665 | A1 | 10/2007 | Sakanoue et al. |
| 2007/0290604 | A1 | 12/2007 | Sakanoue et al. |
| 2008/0063949 | A1 | 3/2008 | Inoue |
| 2008/0150422 | A1 | 6/2008 | Ohara |
| 2008/0231179 | A1 | 9/2008 | Abe et al. |
| 2008/0312437 | A1 | 12/2008 | Inoue et al. |
| 2009/0058268 | A1 | 3/2009 | Yoshida et al. |
| 2009/0115318 | A1 | 5/2009 | Gregory et al. |
| 2009/0160325 | A1 | 6/2009 | Yatsunami et al. |
| 2009/0200917 | A1 | 8/2009 | Yamagata et al. |
| 2009/0224664 | A1 | 9/2009 | Yoshida et al. |
| 2009/0243478 | A1 | 10/2009 | Shoda et al. |
| 2009/0272999 | A1 | 11/2009 | Yoshida et al. |
| 2009/0284135 | A1 | 11/2009 | Yoshida et al. |
| 2009/0284141 | A1 | 11/2009 | Sakanoue et al. |
| 2009/0284144 | A1 | 11/2009 | Fujioka et al. |
| 2009/0284146 | A1 | 11/2009 | Yoshida et al. |
| 2010/0084672 | A1 | 4/2010 | Ueno et al. |
| 2010/0102310 | A1 | 4/2010 | Komatsu et al. |
| 2010/0181554 | A1* | 7/2010 | Yoshida et al. ............. 257/40 |
| 2010/0213827 | A1 | 8/2010 | Yoshida et al. |
| 2010/0258833 | A1 | 10/2010 | Okumoto et al. |
| 2010/0302221 | A1 | 12/2010 | Okumoto |
| 2011/0037065 | A1 | 2/2011 | Ueno et al. |
| 2011/0037068 | A1 | 2/2011 | Yamazaki et al. |
| 2011/0042703 | A1 | 2/2011 | Okumoto et al. |
| 2011/0140091 | A1 | 6/2011 | Friend et al. |
| 2011/0140596 | A1 | 6/2011 | Yoshida et al. |
| 2011/0180821 | A1 | 7/2011 | Matsushima |
| 2011/0198623 | A1 | 8/2011 | Matsushima |
| 2011/0198624 | A1 | 8/2011 | Matsushima |
| 2011/0204410 | A1 | 8/2011 | Yada |
| 2012/0061656 | A1 | 3/2012 | Ohuchi et al. |
| 2012/0132935 | A1 | 5/2012 | Isobe et al. |
| 2012/0178191 | A1 | 7/2012 | Sakanoue et al. |
| 2013/0126841 | A1 | 5/2013 | Nishiyama et al. |

FOREIGN PATENT DOCUMENTS

| | | |
|---|---|---|
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2004/036663 | 4/2004 |
| WO | 2007/037358 | 4/2007 |
| WO | 2008/120714 A1 | 10/2008 |
| WO | 2008/149498 A1 | 12/2008 |
| WO | 2008/149499 A1 | 12/2008 |
| WO | WO 2009/107323 A1 * | 3/2009 ............. 257/40 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

Elam et al., Nucleation and growth during tungsten atomic layer deposition on SiO2 surfaces, 2001, Thin Solid Films, 386, pp. 41-52.*

United States Office Action in U.S. Appl. No. 13/746,474, dated Apr. 11, 2014.

(56) References Cited

OTHER PUBLICATIONS

Ramana et al., "Electron microscopy investigation of structural transformation in tungsten oxide (WO3) thin films", Physica Status Solidi (a) 202, No. 10, pp. R108-R110 (Jul. 6, 2005).

Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).

United States Office Action in U.S. Appl. No. 13/742,600, dated Apr. 14, 2014.

United States Office Action in U.S. Appl. No. 13/746,485, dated Apr. 25, 2014.

China Office Action from State Intellectual Property Office (SIPO) in Chinese Patent Application No. 201080007063.X, dated Mar. 18, 2014, together with an English language Search Report.

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

U.S. Appl. No. 13/205,778 to Kenji Harada et al., filed Aug. 9, 2011.
U.S. Appl. No. 13/360,984 to Satoru Ohuchi et al., filed Jan. 30, 2012.
U.S. Appl. No. 13/736,285 to Seiji Nishiyama et al., filed Jan. 8, 2013.
U.S. Appl. No. 13/746,485 to Kenji Harada et al., filed Jan. 22, 2013.
U.S. Appl. No. 13/742,600 to Kenji Harada et al., filed Jan. 16, 2013.
U.S. Appl. No. 13/721,202 to Kenji Harada et al., filed Dec. 20, 2012.
U.S. Appl. No. 13/746,474 to Kenji Harada et al., filed Jan. 22, 2013.

United States Office Action in U.S. Appl. No. 13/360,984, dated Mar. 1, 2013.

Extended European Search Report (EESR) in European Patent Application No. 10741077.1, dated Feb. 11, 2013.

International Search Report in PCT/JP2010/000783, dated Apr. 6, 2010.
International Search Report in PCT/JP2010/004212, dated Aug. 3, 2010.
International Search Report in PCT/JP2010/004959, dated Nov. 9, 2010.
International Search Report in PCT/JP2010/004993, dated Sep. 7, 2010.
International Search Report in PCT/JP2010/004954, dated Sep. 7, 2010.
International Search Report in PCT/JP2010/004992, dated Nov. 16, 2010.
International Search Report in PCT/JP2010/004956, dated Sep. 7, 2010.
International Search Report in PCT/JP2010/004960, dated Nov. 9, 2010.
International Search Report in PCT/JP2011/006448, dated Feb. 21, 2012.

Tungsten Trioxide, Wikipedia, The Free Encyclopedia, available at http://en.wikipedia.org/wiki/Tungsten(VI)_oxide, accessed Jan. 10, 2014.

Tungsten Oxide, McGraw-Hill Dictionary of Scientific and Technical Terms, McGraw-Hill Book Company, Fourth Edition, p. 1979, left column, date stamped Feb. 28, 1989.

Tungsten Oxide, Iwanami Rikagaku Jiten, Iwanami Shoten, Publishers, Fifth Edition, p. 533, left column, line 42 to right column, line 19, dated Feb. 20, 1998, together with an English language translation thereof.

United States Office Action in U.S. Appl. No. 13/205,778, dated Nov. 13, 2013.

U.S. Appl. No. 14/000,977 to Satoru Ohuchi et al., filed Aug. 22, 2013.

* cited by examiner

○ : Tungsten atom
◐ : Oxygen atom

ORGANIC EL ELEMENT, DISPLAY DEVICE, AND LIGHT-EMITTING DEVICE

CROSS REFERENCE TO RELATED APPLICATION

This is a continuation application of PCT Application No. PCT/JP2010/004954 filed Aug. 6, 2010, designating the United States of America, the disclosure of which, including the specification, drawings and claims, is incorporated herein by reference in its entirety.

TECHNICAL FIELD

The present disclosure relates to an organic electric-field light-emitting element (hereinafter referred to as an "organic EL element"), which is an electric light-emitting element. The present disclosure also relates to a display apparatus and a light-emitting apparatus each having the organic EL element.

DESCRIPTION OF THE RELATED ART

In recent years, progress is being made in research and development of diverse functional elements which involve the use of an organic semiconductor. One typical example of a functional element is an organic EL element. An organic EL element is a current-driven light-emitting element, and commonly has a pair of electrodes, namely an anode and a cathode, and a functional layer layered between the pair of electrodes. The functional layer includes a light-emitting layer composed of an organic material. Upon application of voltage across the pair of electrodes, holes injected from the anode to the functional layer recombine with electrons injected from the cathode to the functional layer. The recombination causes the phenomenon of electroluminescence, which involves emission of light. Being self-luminescent, an organic EL element is highly visible. In addition, being completely solid, an organic EL element has excellent impact resistance. Owing to these advantages, more attention is being given to the applications of organic EL elements as a light-emitting element or a light source for various display apparatuses.

To cause an organic EL element to emit light at high intensity, efficient injection of carriers (i.e., holes and electrons) from the electrodes to the functional layer is beneficial. Generally, the provision of injection layers between each of the electrodes and the functional layer is effective in facilitating efficient injection of carriers. This is because an injection layer serves to lower the energy barrier to be overcome in the injection of carriers. An injection layer disposed between the functional layer and the anode is a hole-injection layer composed of an organic material, such as copper phthalocyanine or PEDOT (conductive polymer), or of a metal oxide, such as molybdenum oxide or tungsten oxide. An electron injection layer disposed between the functional layer and the cathode is composed of an organic material, such as a metal complex or oxadiazole, or of a metal, such as barium.

It has been reported that organic EL elements having a hole injection layer composed of a metal oxide, such as molybdenum oxide or tungsten oxide, exhibit improved hole injection efficiency and longevity (see Patent Literature 1 and Non-Patent Literature 1). It is further reported that the improvement achieved is relevant to the energy level resulting from oxygen vacancies or similar structures of metal oxide on the surface the hole injection layer (see Non-Patent Literature 2).

CITATION LIST

Patent Literature

[Patent Literature 1]
Japanese Patent Application Publication No. 2005-203339
[Patent Literature 2]
Japanese Patent Application Publication No. 2003-249375

Non-Patent Literature

[Non-Patent Literature 1]
Jingze Li et al., Synthetic Metals 151, 141 (2005)
[Non-Patent Literature 2]
Kaname Kanai et al., Organic Electronics 11, 188 (2010)
[Non-Patent Literature 3]
J. B. Pedley et al., Journal of Physical and Chemical Reference Data 12, 967 (1983)
[Non-Patent Literature 4]
I. N. Yakovkin et al., Surface Science 601, 1481 (2007)

SUMMARY

In the manufacturing of an organic EL element, problems are presented by adherents, mainly carbon-containing adherents, derived from molecules of carbon dioxide, water, and organic material contained in the atmosphere or from molecules of impurities generated during the manufacturing steps. To be more specific, in a step of laminating the respective layers of an organic EL element, if a hole injection layer with adherents on its surface is topped with another layer, the adherents are embedded between the layers. The presence of adherents involves the risk of increasing the drive voltage of, and/or reducing the longevity of the resulting organic EL element.

In view of such problems, one non-limiting and exemplary embodiment provides an organic EL element operating at low voltage to emit light at high intensity.

In one general aspect, the techniques disclosed here feature an organic EL element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83, the hole injection layer has a surface facing the functional layer and has a recessed structure such that a portion of the surface overlapping with the light-emitting sublayer is located closer to the anode than other portions of the surface, and the recessed structure has a recessed portion whose inner surface is in contact with the functional layer.

In the organic EL element pertaining to one aspect of the present invention, the hole injection layer comprises tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83. As can be seen from such characteristics of the hole injection layer, adherents have been removed from a surface of the hole injection layer while maintaining an energy level resulting from oxygen vacancies or similar structures present in tungsten oxide on the surface of the hole injection layer. Thus, the organic EL element operates at low voltage to emit light at high intensity.

In addition, when the hole injection layer contains tungsten oxide having such a predetermined occupied energy level as described above, a previously-unknown, unique situation arises where a film thickness of the hole injection layer decreases in the manufacturing of the organic EL element (hereinafter also referred to as "film thickness reduction"). As such, in the organic EL element pertaining to one aspect of the present invention, the hole injection layer has a surface facing the functional layer and has a recessed structure such that a portion of the surface overlapping with the light-emitting layer is located closer to the anode than other portions of the surface, and the recessed structure has a recessed portion (including an inner bottom surface and an inner side surface) whose inner surface is in contact with the functional layer. Since the hole injection layer has such a structure, a bottom portion of ink deposited within a region thereof defined by the banks during the manufacturing of the organic EL element is held within the recessed portion.

Further, since the hole injection layer contains tungsten oxide that is more liquid-philic than the surfaces of the banks and therefore, the inner surface of the recessed portion has high wettability to the ink, and ink deposited within the recessed portion is held stably therein. As such, the ink deposited within the recessed portion does not easily flow over the banks to adjacent pixel regions, which enables patterning of the functional layer to be performed with high precision. In addition, the recessed portion can be easily formed by, for example, causing a part of the hole injection layer to dissolve with pure water. As such, there is no necessity of performing, for yielding a light-emitting element, the complicated and troublesome process of forming banks having a double-layer structure as disclosed in Patent Literature 2. Due to this, the organic EL element pertaining to one aspect of the present invention can be implemented at low cost.

These general and specific aspects may be implemented using an organic EL element, a display apparatus, and a light-emitting apparatus.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIG. 26 is a perspective view illustrating a display apparatus pertaining to embodiment 4 and the like.

DETAILED DESCRIPTION

Figure 1:
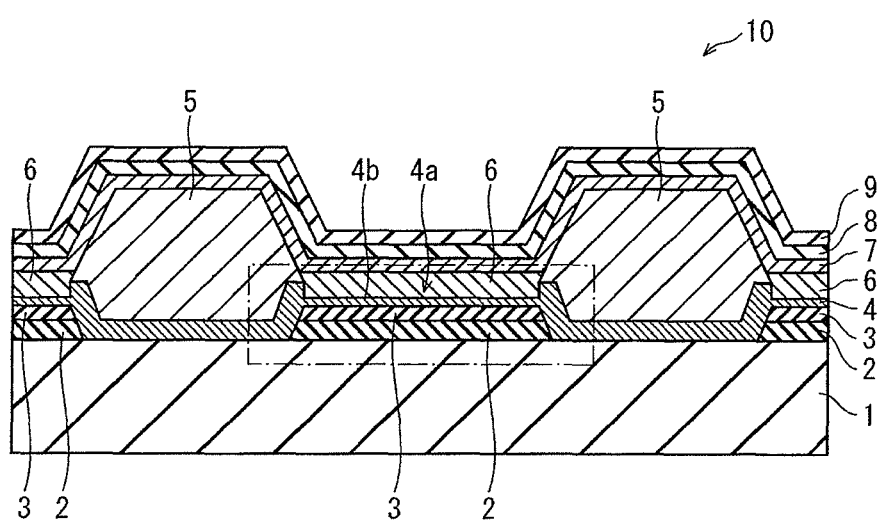
FIG. 1 is a schematic view illustrating a layered state of layers of an organic EL element pertaining to embodiment 1.

[Outline of Aspects of the Present Invention]
One aspect of the present invention is an organic EL element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83, the hole injection layer has a surface facing the functional layer and has a recessed structure such that a portion of the surface overlapping with the light-emitting sublayer is located closer to the anode than other portions of the surface, and the recessed structure has a recessed portion whose inner surface is in contact with the functional layer.

In the organic EL element, in the UPS spectrum, the protrusion may appear within the region corresponding to the binding energy range from approximately 1.8 eV to approximately 3.6 eV lower than the top of the valance band.

Note that, in the present disclosure, a numerical range stated as "from . . . to . . . " is intended to mean that the upper and lower limits are both inclusive. For example, the numerical range "from 1.8 eV to 3.6 eV" includes both 1.8 eV and 3.6 eV.

In the organic EL element, the ratio in the number density of the other atoms to the tungsten atoms may not exceed approximately 0.62. In such a case, the adherent removal effect is assumed to have reached a level of saturation, so that a sufficient adherent removal effect is expected to be achieved.

In the organic EL element, the atoms other than tungsten atoms and oxygen atoms may comprise carbon atoms.

In the organic EL element, the banks may be liquid-repellent and the hole injection layer may be liquid-philic. Note that here, the terms "liquid-philic" and "liquid-repellent" are each used in a relative sense. As described above, the banks are liquid-repellent at least at surfaces thereof. On the other hand, when the hole injection layer is principally composed of a metal compound with liquid-philicity, a surface of the hole injection layer is more liquid-philic than the surfaces of the banks, and the surfaces of the banks are more liquid-repellent than the surface of the hole injection layer. Also, the surface of the hole injection layer having liquid-philicity has high relative wettability to ink, and the surfaces of the banks having liquid-repellency have low relative wettability to the ink. Note that, liquid-philicity or liquid-repellency can be, for example, defined by a contact angle at which the ink meets the surfaces of the banks or the surface of the hole injection layer. For example, when the contact angle is equal to or smaller than 10°, the surfaces are defined as having liquid-philicity, whereas when the contact surface is equal to or greater than 35°, the surfaces are defined to have liquid-repellency.

In the organic EL element, the hole injection layer may be irradiated with ultraviolet light so that: the hole injection layer, in the UPS spectrum obtained from the UPS measurement, has the protrusion appearing near the Fermi surface and within the region corresponding to the binding energy range lower than the top of a valence band; and the tungsten oxide contained in the hole injection layer satisfies the condition, as determined by the XPS measurement, that the ratio in the number density of atoms other than tungsten atoms and oxygen atoms to the tungsten atoms does not exceed approximately 0.83.

One aspect of the present invention is an organic EL element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, an Ultraviolet Photoelectron Spectroscopy (UPS) spectrum, obtained from an UPS measurement, having: a protrusion appearing near a Fermi surface and within a region corresponding to a binding energy range lower than a top of a valence band, and a peak appearing within a region corresponding to a binding energy range from approximately 4.5 eV to approximately 5.4 eV, the hole injection layer has a surface facing the functional layer and has a recessed structure such that a portion of the surface overlapping with the light-emitting sublayer is located closer to the anode than other portions of the surface, and the recessed structure has a recessed portion whose inner surface is in contact with the functional layer.

In the organic EL element, in the UPS spectrum, the protrusion may appear within the region corresponding to the binding energy range from approximately 1.8 eV to approximately 3.6 eV lower than the top of the valance band.

In the organic EL element, the hole injection layer may be irradiated with ultraviolet light so that: the hole injection layer, in the UPS spectrum, obtained by the UPS measurement, has: the protrusion appearing near the Fermi surface and within the region corresponding to the binding energy range lower than the top of the valence band; and the peak appears within the region corresponding to the binding energy range from approximately 4.5 eV to approximately 5.4 eV.

In the organic EL element, the banks may be liquid-repellent and the hole injection layer may be liquid-philic.

One aspect of the present invention is a display apparatus comprising the above organic EL element.

One aspect of the present invention is a light-emitting apparatus comprising the above organic EL element.

EMBODIMENTS

The following describes an organic EL element, a manufacturing method therefor, a display apparatus, and a light-emitting apparatus each according to one aspect of the present invention. Further, results of experiments conducted to confirm the performance of the organic EL element are described, followed by observations on the experimental results. It is to be noted that, in each of the accompanying figures, the relation between sizes of each of the members are not illustrated directly reflecting the actual relation.

Embodiment 1

(Overall Structure of Organic EL Element)

Figure 2:
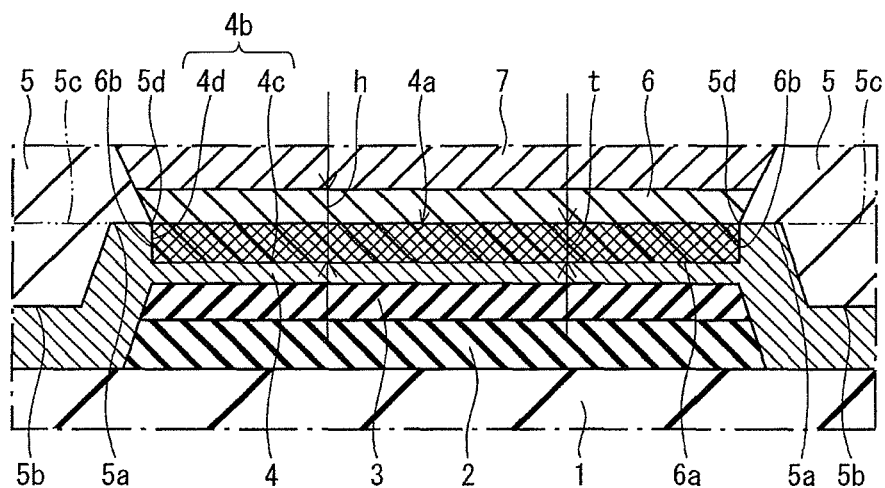
FIG. 2 is an enlarged view of a part surrounded by dashed-dotted lines in FIG. 1.

FIG. 1 is a schematic view illustrating a layered state of layers of an organic EL element pertaining to embodiment 1. FIG. 2 is an enlarged view of a part surrounded by dashed-dotted lines in FIG. 1.

As illustrated in FIG. 1, an organic EL element 10 is a top emission type organic EL element in which pixels corresponding to the colors R, G, and B are arranged so as to form lines or to form a matrix. Further, each pixel has a layered structure where various layers are layered above a substrate 1.

On the TFT substrate 1 (hereinafter referred to simply as the "substrate 1"), an anode 2 is formed so as to form lines or to form a matrix. On the anode 2, an indium tin oxide (ITO) layer 3 and a hole injection layer 4, which functions as a charge injection transport layer, are layered in the stated order. Note that, while the ITO layer 3 is layered only on the anode 2, the hole injection layer 4 is formed not only above the anode 2 but also across an entire upper surface of the substrate 1.

On the hole injection layer 4, banks 5 that define pixels are formed, and in a region defined by the banks 5, a light-emitting layer 6 is disposed. Furthermore, on the light-emitting layer 6, an electron injection layer 7, a cathode 8, and a sealing layer 9 are formed so as to extend over the regions defined by the banks 5 to be continuous between adjacent pixels.

(Constituent Components of Organic EL Element)

The substrate 1 is formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, alumina, etc.

The anode 2 may be formed, for example, with Ag (silver), APC (alloy of silver, palladium, and copper), ARA (alloy of silver, rubidium, and gold), MoCr (alloy of molybdenum and chromium), NiCr (alloy of nickel and chromium), etc. In the case of a top emission type organic EL element, for example, the anode 2 may be formed with a light-reflective material. The anode 2 and the cathode 8 are connected to a direct current power source DC to supply power to the organic EL element 10 from the outside.

The ITO layer 3 is, for example, 50 nm-thick, is interposed between the anode 2 and the hole injection layer 4, and has the function of enhancing the bonding between the anode 2 and the hole injection layer 4.

The hole injection layer 4 is, for example, a 30 nm-thick thin film (layer) and is composed of tungsten oxide (WOx). In the formula (WOx) representing the composition of tungsten oxide, x is a real number generally falling within the range of $2<x<3$. For example, the hole injection layer 4 may consist only of tungsten oxide. However, the inclusion of a trace level of impurities is acceptable, provided that the amount does not exceed the amount of impurities which may be incorporated as a result of normal processing.

As illustrated in FIG. 2, the hole injection layer 4 extends along the bottom surfaces of the banks 5 in the direction of adjacent pixels. Also, within a region defined by the banks 5, the hole injection layer 4 has a recessed structure such that the hole injection layer 4 is lower in level than the bottom surfaces of the banks 5, and includes a recessed portion 4a (indicated with meshed hatching in FIG. 2) formed by being dissolved by a predetermined dissolution liquid. In addition, the film thickness of the hole injection layer 4 within the region defined by the banks 5 is smaller than the film thickness of the hole injection layer 4 in other regions thereof, and further, the film thickness of the hole injection layer 4 in the other regions is substantially uniform throughout the entirety of the other regions. Since the hole injection layer 4 is formed with tungsten oxide having liquid-philicity, an inner surface 4b of the recessed portion 4a has excellent wettability to ink. Accordingly, this allows for ink deposited with respect to the region of the hole injection layer 4 defined by the banks 5 to easily adhere to the inner surface 4b of the recessed portion 4a, and further, the possibility is higher of deposited ink remaining within the region defined by the banks 5.

Note that, the hole injection layer 4 need not have a recessed structure such that the recess portion 4a is lower in level than the entire bottom surface of the banks 5. That is, the recessed structure suffices if the recessed portion 4a is lower in level than a peripheral portion 5a of the bottom surface of the banks 5. In the present embodiment, the hole injection layer 4 has a recessed structure such that the recessed portion 4a is lower in level than the peripheral portion 5a of the bottom surface of the banks 5 but not lower than a central portion 5b of the bottom surface of the banks 5. However, the hole injection layer 4 may alternatively have a recessed structure such that, for example, by setting the central portion 5b at the same level as the peripheral portion 5a and by planarizing the bottom surface of the banks 5 as indicated by the chained double-dashed line 5c in FIG. 2, the recessed portion 4a is lower in level than the entire bottom surface of the banks 5.

The hole injection layer 4 has a recessed structure falling lower in level starting from a portion corresponding to a bottom periphery 5d of the banks 5. To be specific, a region of an upper surface of the hole injection layer 4, which is defined by the banks 5, drops lower in level in a direction substantially vertical to the upper surface of the substrate 1 from the portion corresponding to the bottom periphery 5d. When the hole injection layer 4 has a recessed structure falling lower in level starting from the portion corresponding to the bottom periphery 5d, the film thickness of the light-emitting layer 6 can be uniformed over a wide range, and as a result, the risk of irregular luminance occurring in the light-emitting layer 6 is reduced.

Figure 3:
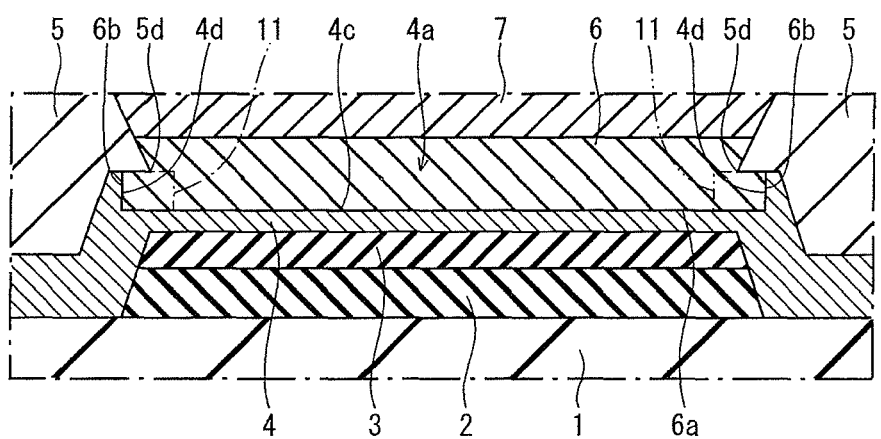
FIG. 3 is an enlarged view of the part surrounded by dashed-dotted lines in FIG. 1 in an organic EL element pertaining to a modification.

Note that the present disclosure is not limited to the hole injection layer 4 having a recessed structure falling lower in level starting from the portion corresponding to the bottom periphery 5d. For instance, alternatively, the hole injection layer 4 may have a recessed structure falling lower in level starting from a portion closer to an adjacent pixel than the portion corresponding to the bottom periphery 5d of the banks 5, as illustrated in FIG. 3. Alternatively, the hole injection layer 4 may have a recessed structure falling lower in level starting from a portion closer to a central portion of the pixel than the portion corresponding to the bottom periphery 5d of the banks 5. In such a case, the recessed portion 4a has a profile as indicated by the chained double-dashed line 11 in FIG. 3.

In addition, the recessed structure of the hole injection layer 4 has a cup-like shape. To be more specific, an inner surface 4b of the recessed portion 4a is composed of an inner bottom surface 4c and an inner side surface 4d. The inner bottom surface 4c is planar and substantially parallel with the upper surface of the substrate 1, and is in contact with a bottom surface 6a of the light-emitting layer 6. The inner side surface 4d extends from a periphery of the inner bottom surface 4c in a direction substantially perpendicular to the upper surface of the substrate 1, and is in contact with a side surface 6b of the light-emitting layer 6. When the recessed structure has a cup-like shape as described above, the inner side surface 4d prevents ink deposited to within the recessed portion 4a from moving in a direction parallel to the upper surface of the substrate 1. Accordingly, it is possible to more stably hold deposited ink within the region defined by the banks 5. Moreover, when the recessed structure has the cup-like shape as described above, the inner surface 4b of the recessed portion 4a becomes larger in area, and a contact surface between deposited ink and the hole injection layer 4 becomes larger in area. Accordingly, it is possible to more stably hold deposited ink within the region defined by the banks 5. Therefore, patterning of the light-emitting layer 6 can be performed with high precision.

Figure 4:
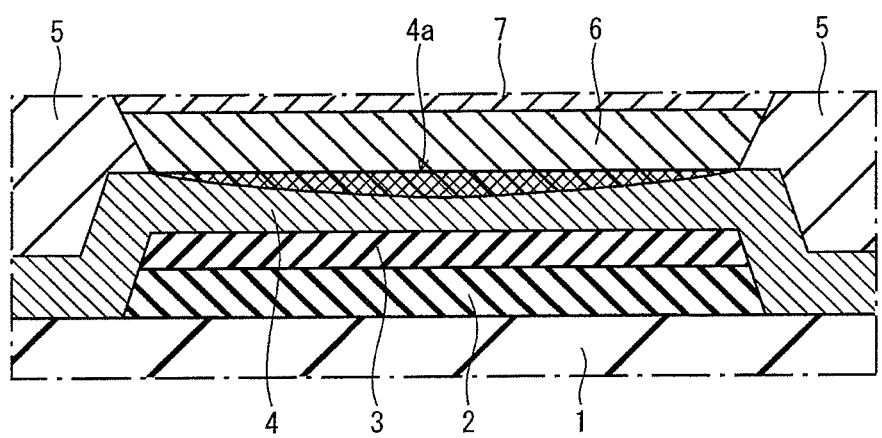
FIG. 4 is an enlarged view of the part surrounded by dashed-dotted lines in FIG. 1 in an organic EL element pertaining to a modification.

Note that the hole-injection layer 4 is not limited to having a recessed structure having a cup-like shape as described above. That is, as illustrated in FIG. 4, a cross-sectional shape of the recessed portion 4a (indicated with mesh hatching in FIG. 4) may have a plate-like shape such as a substantially fan-shape and a substantially V shape.

Returning to FIG. 2, although the present disclosure does not intend to specifically specify an average depth t of the recessed portion 4a, the average depth t may be 5-100 nm, for example. If the average depth t of the recessed portion 4a is set to be equal to or greater than 5 nm, it is possible to hold a sufficient amount of deposited ink within the recessed portion 4a. Accordingly, it is possible to stably maintain deposited ink within the region defined by the banks 5. Furthermore, since the light-emitting layer 6 is formed so as to reach a periphery of the banks 5 without being repelled when the average depth t of the recessed portion 4a is set to be equal to or greater than 5 nm, short circuit between the anode 2 and the cathode 8 can be prevented.

Note that, the average depth t of the recessed portion 4a can be obtained by measuring a surface profile of the hole injection layer 4 with use of a stylus profiler meter or an AFM (Atomic Force Microscope) and calculating a difference between an average height of peak portions of the surface profile and an average height of bottom portions of the surface profile.

In the meantime, the present disclosure does not specifically specify the film thickness of the light-emitting layer 6. However, when an average film thickness h of the light-emitting layer 6 after drying is set to be equal to or greater than 100 nm and the average depth t of the recessed portion 4a is set to be equal to or smaller than 100 nm, for example, it is possible to uniform the film thickness of the light-emitting layer 6 within the region defined by the banks 5.

Figure 5A:
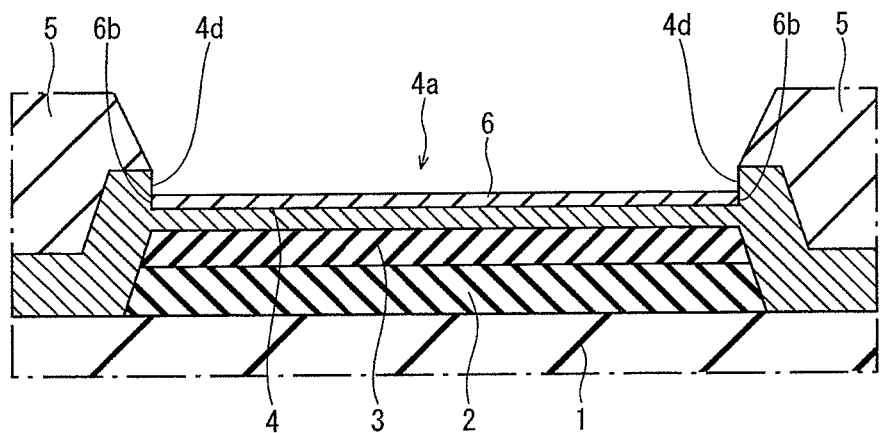
FIGS. 5A and 5B are schematic views for explaining an optimum thickness of a light-emitting layer.
Figure 5B:
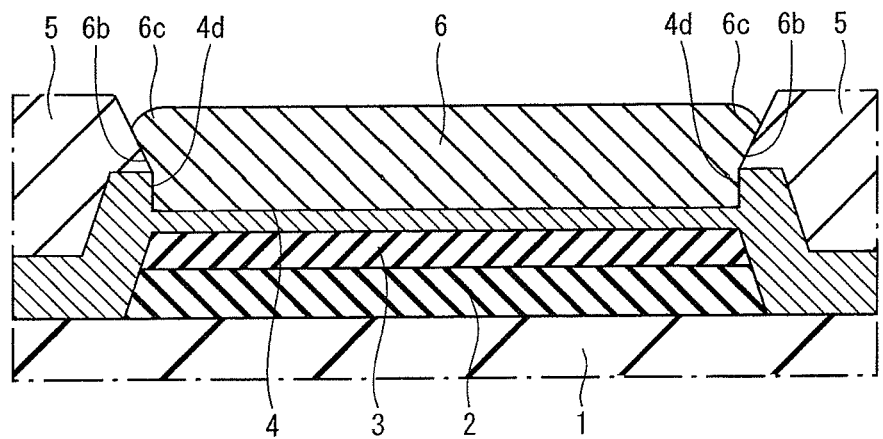

Furthermore, for example, a difference between the average film thickness h of the light-emitting layer 6 and the average depth t of the recessed portion 4a may be set to be equal to or smaller than 20 nm. When the average film thickness h of the light-emitting layer 6 is excessively smaller than the average depth t of the recessed portion 4a (for example, when t−h>20 nm), a portion of the inner side surface 4d of the recessed portion 4a does not come in contact with the light-emitting layer 6 (a portion onto which the light-emitting layer 6 has not been applied), as illustrated in FIG. 5A. Then a short circuit might occur between the anode 2 and the cathode 8 at that portion. On the other hand, when the average film thickness h of the light-emitting layer 6 is excessively greater than the average depth t of the recessed portion 4a (for example, h−t>20 nm), liquid-repellency of the banks 5 causes a film thickness of a bank vicinity portion 6c of the light-emitting layer 6 to become smaller than other portions of the light-emitting layer 6, as illustrated in FIG. 5B. As a result, the light-emitting layer 6 is formed to have a substantially convex cross-sectional shape, which may result in unevenness in light emission caused by difference in film thickness.

Note that, the inner side surface 4d of the recessed portion 4a needs to be in contact with only at least a part of the side surface 6b of the light-emitting layer 6. For example, as illustrated in FIG. 2 and FIG. 5B, when the average film thickness h of the light-emitting layer 6 is equal to or greater than the average depth t of the recessed portion 4a, the inner side surface 4d of the recessed portion 4a is in contact with only a lower part of the side surface 6b of the light-emitting layer 6. On the other hand, as illustrated in FIG. 5A, when the average film thickness h of the light-emitting layer 6 is smaller than the average depth t of the recessed portion 4a, the side surface 6b of the light-emitting layer 6 is entirely in contact with the inner side surface 4d of the recessed portion 4a.

Figure 6:
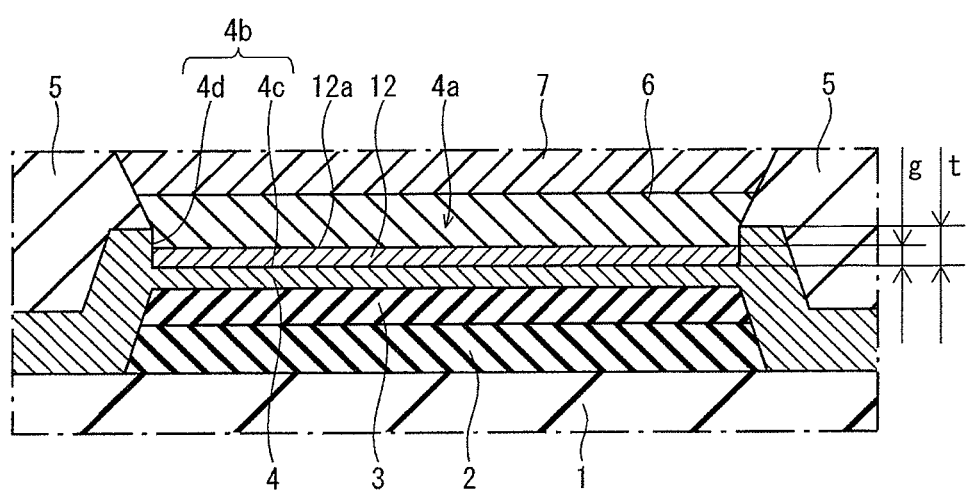
FIG. 6 is an enlarged view of the part surrounded by dashed-dotted lines in FIG. 1 in an organic EL element pertaining to a modification.

As illustrated in FIG. 6, in the recessed portion 4a of the hole injection layer 4, a liquid-philic layer such as an IL layer (intermediate layer), which is a hole transport layer 12 constituting the functional layer, may be formed under the light-emitting layer 6. In this case, ink is deposited not on the inner bottom surface 4c of the recessed portion 4a but on an upper surface 12a of the hole transport layer 12. Even in such a case, since the upper surface 12a of the hole transport layer 12 is liquid-philic, it is possible to stably hold deposited ink within the region defined by the banks 5. However, when the hole transport layer 12 fills the recessed portion 4a completely, the inner side surface 4d of the recessed portion 4a no longer comes into contact with deposited ink. As such, for example, an average film thickness g of the hole transport layer 12 may be set so as to be smaller than the average depth t of the recessed portion 4a. Note that the IL layer as described above is not limited to having a function of transporting holes. That is, the IL layer may be provided with a function of blocking electrons and/or a function of adjusting optical characteristics.

The hole transport layer 12 is a layer having a thickness of about 10 nm to 20 nm and has a function of transporting, into the light-emitting layer 6, holes injected from the hole injection layer 4. The hole transport layer 12 is formed with organic material having hole-transporting characteristics. Organic material having hole-transporting characteristics as described above refers to organic material having characteristics of conveying holes having been generated by making use of a charge transfer effect occurring between molecules. Organic material having such characteristics is also referred to as a p-type semiconductor.

The hole transport layer 12 may be formed with either high molecular material or low molecular material, and is formed by application of a wet printing process. In addition, for example, the hole transport layer 12 may include a crosslinking agent, which prevents the hole transport layer 12 from dissolving and flowing out into the light-emitting layer 6 formed thereon upon forming of the light-emitting layer 6. Examples of material having hole-transporting characteristics that may be utilized include a copolymer containing a fluorene unit and a triarylamine unit, and a triarylamine derivative having low molecular weight. One example of the crosslinking agent that may be utilized is dipentaerythritol hexaacrylate. In this case, for example, the hole transport layer 12 may be formed with poly(3,4-ethylenedioxythiophene) doped with poly(styrenesulfonate) (PEDOT-PSS) or a derivative thereof (copolymer or the like).

By being formed under predetermined conditions, the hole injection layer 4 is ensured to have, on its surface (including the inner surface 4b of the recessed portion 4a), an energy level resulting from oxygen vacancies or similar structures present in tungsten oxide. The presence of the energy level enables effective hole injections. In addition, subsequent to the layer formation, the hole injection layer 4 is irradiated with ultraviolet light of a predetermined wavelength in the atmosphere. As a result of the ultraviolet (UV) irradiation, the surface (including the inner surface 4b of the recessed portion 4a) of the hole injection layer 4 is cleaned to reduce adherents thereon, without affecting the energy level resulting from oxygen vacancies or similar structures present in tungsten oxide. In addition, the duration and intensity of UV irradiation is set so that, in a photoelectron spectrum exhibited by the hole injection layer 4 after the UV irradiation, changes in shape of a spectral region corresponding to a predetermined range of binding energy converge (note that in this disclosure, the expression "converge" is used with the intension of indicating a state where the shape of the spectral region no longer changes). With the setting, the maximum effect of removing adherents is achieved by UV irradiation performed at the minimum conditions.

The banks 5 are formed with organic material such as resin or inorganic material such as glass and has insulating properties. Examples of organic material that can be used for forming the banks 5 include: acrylic resin; polyimide resin; and novolac type phenolic resin. Examples of inorganic material that can be used for forming the banks 5 include: SiO₂ (silicon dioxide) and $Si_3N_4$ (silicon nitride). For example, the banks 5 may have organic solvent resistance and have a certain level of light transparency to visible light. Further, since there are cases where the banks 5 undergo etching, baking and other similar processing, for example, the banks 5 may be formed by using a material having a high degree of resistance against such processing.

In addition, for example, at least the surfaces of the banks 5 may be provided with liquid-repellency. As such, when forming the banks 5 with liquid-philic material, it is exemplary to provide the surfaces of the banks 5 with liquid-repellency by performing a liquid-repellent treatment or the like.

Note that the banks 5 may be formed so as to form a pixel bank structure or may be formed so as to form a line bank structure. When the banks 5 are formed so as to form a pixel bank structure, the banks 5 are formed so as to surround the light-emitting layer 6 corresponding to one subpixel from all directions. On the other hand, when the banks 5 are formed so as to form a line bank structure, the banks 5 are fat med so as to partition pixels by columns or by rows. Further, in a line bank structure, the banks 5 exist at both sides of the light-emitting layer 6 in either the row direction or in the column direction. When the banks 5 form a line bank structure, the light-emitting layer 6 is formed so as to be continuous in either the column direction or the row direction.

The light-emitting layer 6 is a 70 nm-thick layer of F8BT (poly(9,9-di-n-octylfluorene-alt-benzothiadiazole)), which is an organic polymer, and emits light as a result of recombination of holes and electrons which are injected thereto. However, the material of the light-emitting layer 6 is not limited to this, and the light-emitting layer 6 may contain a commonly-known organic material. For example, the light-emitting layer 6 may be formed by using fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488. When the light-emitting layer 6 includes a layer formed with high molecular material, the light-emitting layer 6 can be formed by forming the layer of high molecular material by application of a printing technology such as an inkjet method and a nozzle coating method. The forming of the light-emitting layer 6 in such a manner readily contributes in the reduction of cost in the manufacturing of large-sized organic EL panels compared to when a vapor deposition method using low molecular material is applied.

The electron injection layer 7 is for example, a 5 nm-thick layer having a function of transporting electrons injected from the cathode 8 to the light-emitting layer 6. For example, the electron injection layer 7 may be formed by using, for example, barium, phthalocyanine, lithium fluoride or any mixture of such materials, etc.

The cathode 8 is, for example, a 100 nm-thick layer and is formed by using, for example, aluminum, ITO, IZO (indium zinc oxide) or the like. Further, for a top emission type organic EL element 10, for example, the cathode 8 may be formed by using light-transmissive material.

The sealing layer 9 inhibits the light-emitting layer 6 and the like from being exposed to moisture, air, etc., and is formed by using material such as SiN (silicon nitride) and SiON (silicon oxynitride). The sealing layer 9 is formed so as to encapsulate the organic EL element 10 therein. Further, for a top emission type organic EL element 10, for example, the sealing layer 9 may be formed by using light-transmissive material. Note that alternatively, a sealing cap may be provided to isolate the entire organic EL element 10 from external space. When using a sealing cap to prevent atmospheric exposure of the organic EL element 10, the sealing cap may be formed by using, for example, the same material as the substrate 1, and a getter which absorbs moisture and the like may be provided within the sealed space formed by the substrate 1 and the sealing cap.

Figure 7:
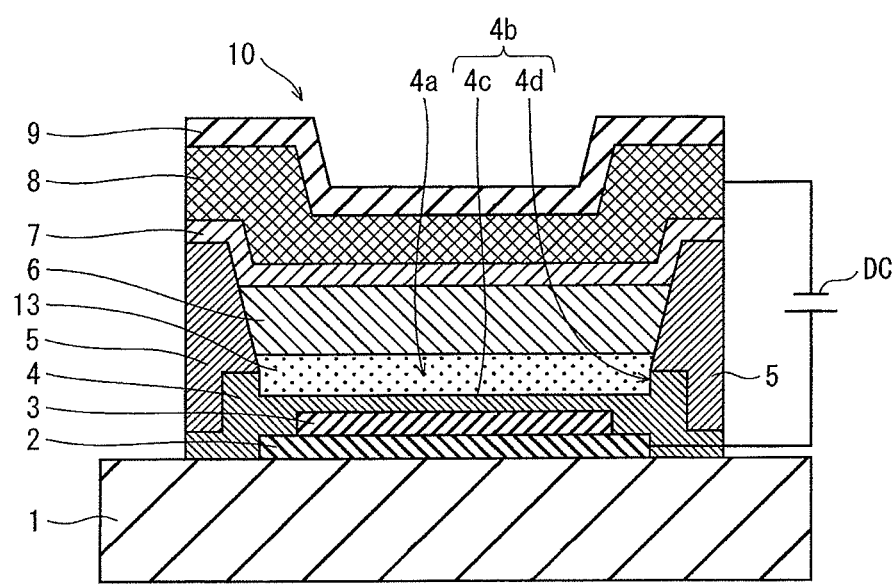
FIG. 7 is a schematic cross-sectional view illustrating a structure of an organic EL element pertaining to a modification.

In addition, the organic EL element 10 pertaining to embodiment 1 may have a buffer layer 13 interposed between the hole injection layer 4 and the light-emitting layer 6, as illustrated in FIG. 7. The buffer layer 13 is used for adjusting optical characteristics and/or for blocking electrons. The buffer layer 13 is, for example, a 20 nm-thick layer of TFB (poly(9,9-di-n-octylfluorene-alt-(1,4-phenylene-((4-sec-butylphenyl)imino)-1, 4-phenylene)), which is an amine-containing organic polymer.

Here, note that the buffer layer 13 may be provided with a function of transporting holes in addition to the above-described functions. In this sense, the buffer layer 13 may constitute the same functional layer as the IL layer illustrated in FIG. 6.

The functional layer of the present disclosure is either one of, a combination of more than two of, or a combination of all of a hole transport layer; a light-emitting layer; a buffer layer; an electron injection layer; and an electron transport layer. Although the present disclosure focuses on the hole injection layer, an organic EL element commonly includes, in addition to the hole injection layer, layers each having a corresponding function, such as the above-described hole transfer layer, light-emitting layer and the like. As such, the expression "functional layer" collectively refers to all such layers which are desirably included in the organic EL element, aside from the hole injection layer to which the present disclosure is directed.

(Effects and Advantages of Organic EL Element)

As described above, the hole injection layer 4 of the organic EL element 10 contains tungsten oxide. In addition, after the formation of the hole injection layer 4, a surface thereof is exposed to ultraviolet light of a predetermined wavelength. As a result, adherents on the surface of the holes injection layer 4 have been removed to a maximum, without affecting the energy level of the hole injection layer 4 resulting from oxygen vacancies or similar structures present in tungsten oxide. This enables the organic EL element 10 to be driven with low drive voltage and have longevity.

In addition, in the organic EL element 10, the inner surface 4b (i.e., the inner bottom surface 4c and the inner side surface 4d) of the recessed portion 4a in the recessed structure of the hole injection layer 4 is in contact with the functional layer. Due to this, ink is prevented from flowing out over the banks 5 to adjacent pixel regions, and hence, patterning of the functional layer can be performed with high precision.

(Manufacturing Method of Organic EL Element)

FIGS. 8A-8D each illustrate a step in a manufacturing method of the organic EL element pertaining to embodiment 1. FIGS. 9E-9H each illustrate a step, following the steps illustrated in FIGS. 8A-8D, in the manufacturing method of the organic EL element pertaining to embodiment 1.

Figure 8A:
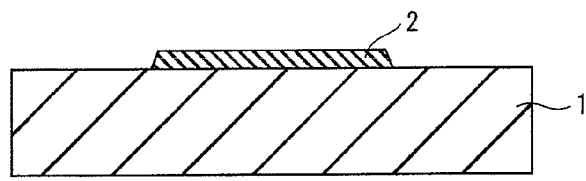
FIGS. 8A-8D each illustrate a step in a manufacturing method of the organic EL element pertaining to embodiment 1.

In the manufacturing of the organic EL element 10 pertaining to embodiment 1, firstly, the substrate 1, which is made of glass, for example, is mounted inside a chamber of a sputtering film-forming device. Then, a predetermined sputtering gas is introduced into the chamber, and a thin film of Ag is formed on the substrate 1 according to a reactive sputtering method, as illustrated in FIG. 8A. Subsequently, the anode 2 is formed so as to form lines or to form a matrix by patterning the Ag thin film by photolithography, for example. Alternatively, the Ag thin film may be formed by application of a vacuum deposition method or the like.

Figure 8B:
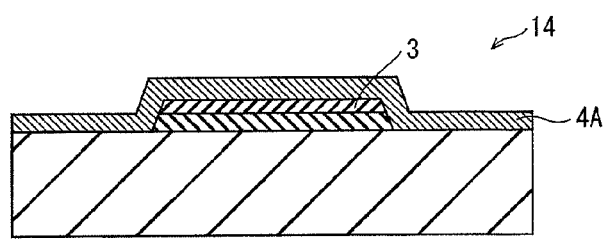

Next, as illustrated in FIG. 8B, an ITO thin film is formed according to, for example, a reactive sputtering method, and then the ITO layer 3 is formed by patterning the ITO thin film by photolithography, for example.

Subsequently, a thin film 4 containing tungsten oxide that is soluble with respect to the predetermined dissolution liquid is formed. Here, for instance, the thin film 4A is formed by utilizing a compound containing tungsten oxide and such that, by application of a vacuum deposition method or a reactive sputtering method, a film thickness of the thin film 4A of tungsten oxide is uniform across an entire upper surface of the substrate 1. More specifically, a reactive sputtering method is performed after replacing the previous sputtering target with metal tungsten. An argon gas and an oxygen gas are introduced into the chamber as the sputtering gas and the reactive gas, respectively. Under this state, high voltage is applied to ionize the argon, so that the ionized argon is caused to bombard the sputtering target. The metal tungsten ejected as a result of the sputtering phenomenon reacts with the oxygen, and produces tungsten oxide. As a result, the "sputtered" tungsten oxide forms the thin film 4A on the anode 2 of the substrate 1.

The film formation described above is performed under the following conditions: (i) the substrate temperature is not controlled; (ii) gas pressure (total gas pressure) is equal to 2.3 Pa; (iii) the ratio of oxygen partial pressure to the total gas pressure is equal to 50%; and (iv) input power per unit surface area of the sputtering target (input power density) is equal to 1.2 W/cm$^2$. The thin film 4A formed under the above conditions has the energy level resulting from oxygen vacancies or similar structures on its surface.

Figure 8C:
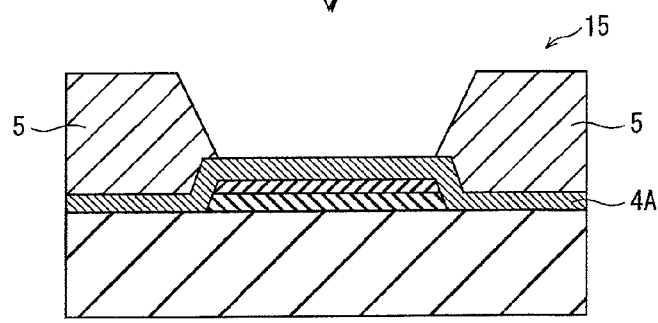

Next, as illustrated in FIG. 8C, the banks 5 are formed so as to surround each pixel region (i.e., the region at which the anode 2 is positioned), by application of, for example, photolithography. In specific, the banks 5 are formed, for example, (i) by forming, as a bank film, a resist film (for example, a resin film) including resist material as bank material on the thin film 4A by, for example, application of the resist material, (ii) forming a resist pattern on the resist film, and (iii) by removing desired portions of the resist film by etching utilizing a developing solution and thereby forming a pattern of the banks 5. Note that, when the banks 5 are formed with inorganic material, the banks 5 are formed by application of a CVD method, for example. Residuals of resist material remaining adhered on a surface of the thin film 4A after etching are removed by hydrofluoric acid, pure water or the like, for example. Furthermore, a liquid-repellent treatment is performed with respect to the surfaces of the banks 5 as necessary. Here, the expression "a resist film including resist material" indicates "a resist film including resist material as bank material, which is formed as a bank film".

Figure 8D:
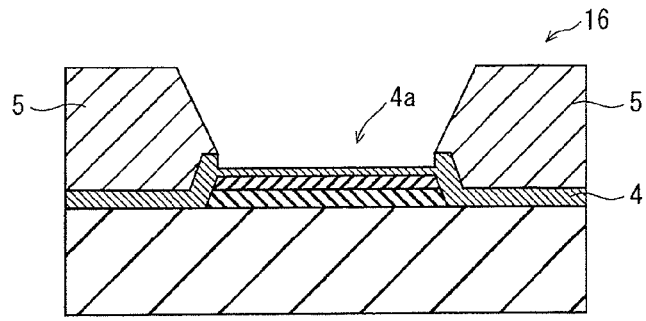

Subsequently, as illustrated in FIG. 8D, the hole injection layer 4 is formed by causing a portion of the thin film 4A to dissolve and thereby forming the recessed portion 4a. By forming the hole injection layer 4 in such a manner, the hole injection layer 4 is provided with a structure such that the region thereof defined by the banks 5 has smaller film thickness compared to other regions thereof. The forming of the recessed portion 4a is performed by, for example, causing a region of an upper surface of the thin film 4A defined by the banks 5 to dissolve with pure water during a pure water cleaning process where impurities, such as hydrofluoric acid, remaining on the surfaces of the banks 5 are removed by cleaning with pure water after the residuals of resist material have been removed. In such a case, pure water is the predetermined dissolution liquid, and it is possible to change a depth and a shape of the recessed portion 4a as necessary by changing the conditions according to which the pure water cleaning process is performed.

As for a specific method, for example, the substrate 1 is cleaned by ejecting pure water (for example, pure water at room temperature) thereon, while being kept in a rotating-state by a spin coater. Subsequently, while the substrate 1 is kept in the rotating-state, the ejection of pure water is stopped, and accordingly, the pure water is drained off from the substrate 1. In such a case, it is possible to change the depth and the shape of the recessed portion 4a by changing a time period during which pure water is ejected onto the substrate 1. In addition, since the speed at which the thin film 4A dissolves also changes according to the temperature of pure water, it is also possible to adjust the depth and the shape of the recessed portion 4a by changing the temperature of pure water ejected.

The method utilized for forming the recessed portion 4a is not limited to the above-described method. For example, the recessed portion 4a may be formed by causing a portion of the thin film 4A to dissolve to a cleaning liquid such as pure water while the residuals of resist adhering onto the surface of the thin film 4A are being removed by utilizing the cleaning liquid after the banks 5 have been formed. In such a case, the cleaning liquid is the predetermined dissolution liquid. In addition, the recessed portion 4a may be formed by causing a portion of the thin film 4A to dissolve to a developing solution while the banks 5 are formed by etching the resist film by using the developing solution and the residuals of resist adhering onto the surface of the thin film 4A are being removed by utilizing the developing solution. In such a case, the developing solution is the predetermined dissolution liquid.

When the hole injection layer 4 is formed by dissolving the thin film 4A with use of a dissolution liquid such as the cleaning liquid and the developing solution that are used in the bank forming process, the forming of the hole injection layer 4 can be performed with a high degree of efficiency since there is no need to utilize a different predetermined dissolution liquid for forming the recessed portion 4a, and further, since there is no need to perform an additional process for forming the recessed portion 4a.

Note that the recessed portion 4a is not limited to being formed by using the predetermined dissolution liquid. For instance, the recessed portion 4a may be formed by first forming a thin film made of tungsten oxide by sputtering and photolithography at all regions other than the region at which the anode 2 is positioned, and then forming another thin film made of tungsten oxide so as to cover all regions, including the region at which the anode 2 is positioned. As such, the hole injection layer 4 having a recessed shape at the region at which the anode 2 is arranged is formed.

Figure 9E:
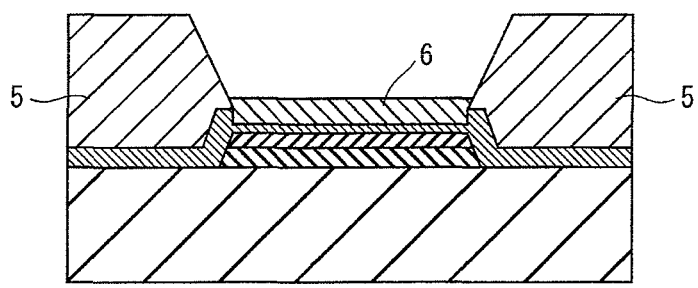
FIGS. 9E-9H each illustrate a step, following the steps illustrated in FIGS. 8A-8D, in the manufacturing method of the organic EL element pertaining to embodiment 1.

Next, as illustrated in FIG. 9E, the light-emitting layer 6 is formed by depositing drops of ink composition containing organic light-emitting material according to, for example, an inkjet method in the region defined by the banks 5, by applying the ink along the inner bottom surface 4c and the inner side surface 4d of the hole injection layer 4, by removing the solvent of the ink composition by volatilization, and by performing drying.

Note that, when forming the buffer layer 13 between the hole injection layer 4 and the light-emitting layer 6, the buffer layer 13 is formed in a similar manner as in the forming of the light-emitting layer 6 as described above. That is, the buffer layer 13 is formed by depositing drops of ink composition containing organic amine-containing molecular material and removing the solvent of the ink composition by volatilization. In addition, the depositing and applying of ink in the forming of the buffer layer 13 and the light-emitting layer 6 may be performed according to methods other than an inkjet method, such as a dispenser method, a nozzle coating method, a spin coating method, intaglio printing, and relief printing.

Figure 9F:
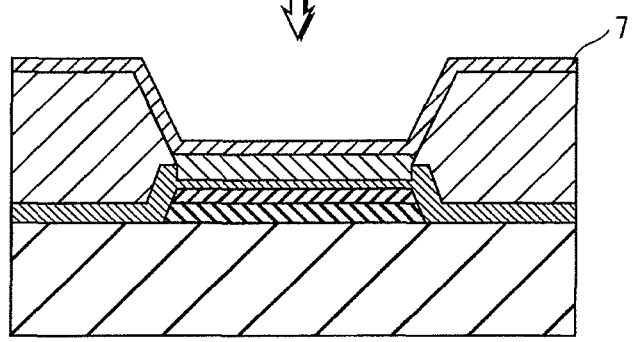
Figure 9G:
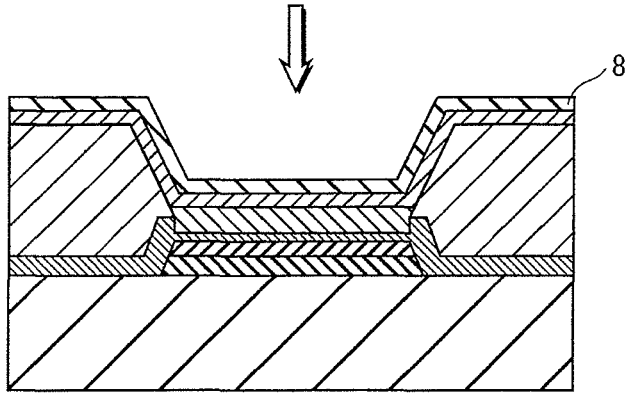
Figure 9H:
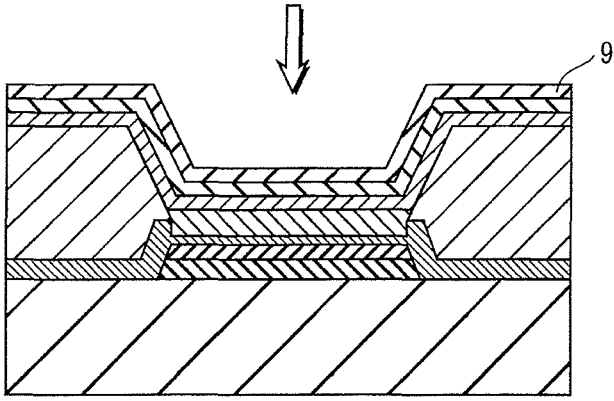

Subsequently, as illustrated in FIG. 9F, a thin film of barium, which is to become the electron injection layer 7, is formed by, for example, vacuum deposition. Then as illustrated in FIG. 9G, a thin film of aluminum, which is to become the cathode 8, is formed by, for example, vacuum deposition. Successively, as illustrated in FIG. 9H, the sealing layer 9 is formed.

In the steps described above, following the forming of the thin film 4A, an intermediate product having the thin film 4A formed thereon is taken out from the chamber and is exposed to the atmosphere. Due to the atmospheric exposure, the surface of the thin film 4A and the surface (including the inner surface 4b of the recessed portion 4a) of the hole injection layer 4, which is to be formed from the thin film 4A, adsorbs gas molecules and the like. In addition, while the intermediate product is placed within the chamber, the surface of the thin film 4A and the surface of the hole injection layer 4 adsorbs impurity molecules and the like.

So as to remove such adherents from the surface of the thin film 4A and the surface of the hole injection layer 4, an intermediate product having the thin film 4A formed therein but still not having the functional layer (including the light-emitting layer 6 and the buffer layer 13 in embodiment 1) formed therein is irradiated with ultraviolet light in the atmosphere. For instance, the surface of the thin film 4A of an intermediate product 14 illustrated in FIG. 8B, the surface of the thin film 4A of an intermediate product 15 illustrated in FIG. 8C, or the surface of the hole injection layer 4 of an intermediate product 16 illustrated in FIG. 8D is irradiated with ultraviolet light.

Note that, when the thin film 4A is exposed to the atmosphere after the step illustrated in FIG. 8B, the surface of the thin film 4A illustrated in FIG. 8B is irradiated with ultraviolet light. Similarly, when the thin film 4A is exposed to the atmosphere after the step illustrated in FIG. 8C, the surface of the thin film 4A illustrated in FIG. 8C is irradiated with ultraviolet light. This is since, by performing the irradiation with ultraviolet light at such points, the removal of gas molecules and impurities adsorbed by the surface of the thin film 4A can be performed quickly at an early stage as possible. In addition, in the step illustrated in FIG. 8D, which follows the steps illustrated in FIGS. 8B and 8C, a decrease is observed in the film thickness of the thin film 4A (hereinafter referred to as "film thickness reduction"), and due to this, the surface of the thin film 4A falls lower in terms of level. As such, when the film thickness reduction takes place in the step illustrated in FIG. 8D, there is a possibility that the gas molecules and the impurities adsorbed by the surface of the thin film 4A can be removed along with the portion of the surface of the thin film 4A being removed as a result of the film thickness reduction. When the film thickness reduction takes place, the adherents on the surface of the thin film 4A can be removed nearly completely when a relation between the amount of the thin film 4A decreasing as a result of the film thickness reduction (hereinafter referred to as a "film thickness reduction amount") and a depth in the thin film 4A at which the adsorbed adherents are present (hereinafter referred to as an "adsorption depth") satisfies a certain condition. In specific, when the film thickness reduction amount is sufficiently greater than the adsorption depth, the adherents on the surface of the thin film 4A can be removed nearly completely. Due to this, in such a case, the necessity is reduced of irradiating the thin film 4A with ultraviolet light after exposing the thin film 4A to the atmosphere following the step illustrated in FIG. 8B or following the step illustrated in FIG. 8C. In contrast, when the film thickness reduction amount is smaller than the adsorption depth, there is a possibility of adherents remaining on the surface of the thin film 4A even after the film thickness reduction. Due to this, in such a case, for example, the thin film 4A exposed to the atmosphere after the step illustrated in FIG. 8B or after the step illustrated in FIG. 8C may be irradiated with ultraviolet light so as to preemptively remove the adherents prior to the film thickness reduction.

In addition, when the thin film 4A is exposed to the atmosphere after the step illustrated in FIG. 8D, the surface of the thin film 4A illustrated in FIG. 8D is irradiated with ultraviolet light. This is since, by performing the irradiation with ultraviolet light at such a point, residuals of the material for forming the banks 5 adhering to the surface of the thin film 4A can be removed at the same time as removing molecules adsorbed by the surface of the thin film 4A.

Note that the irradiation with ultraviolet light may be performed with respect to either one of the intermediate products 14, 15, and 16, or may be performed with respect to more than one of the intermediate products 14, 15, and 16 (including a case where irradiation with ultraviolet light is performed with respect to all of the intermediate products 14, 15 and 16).

Figure 10:
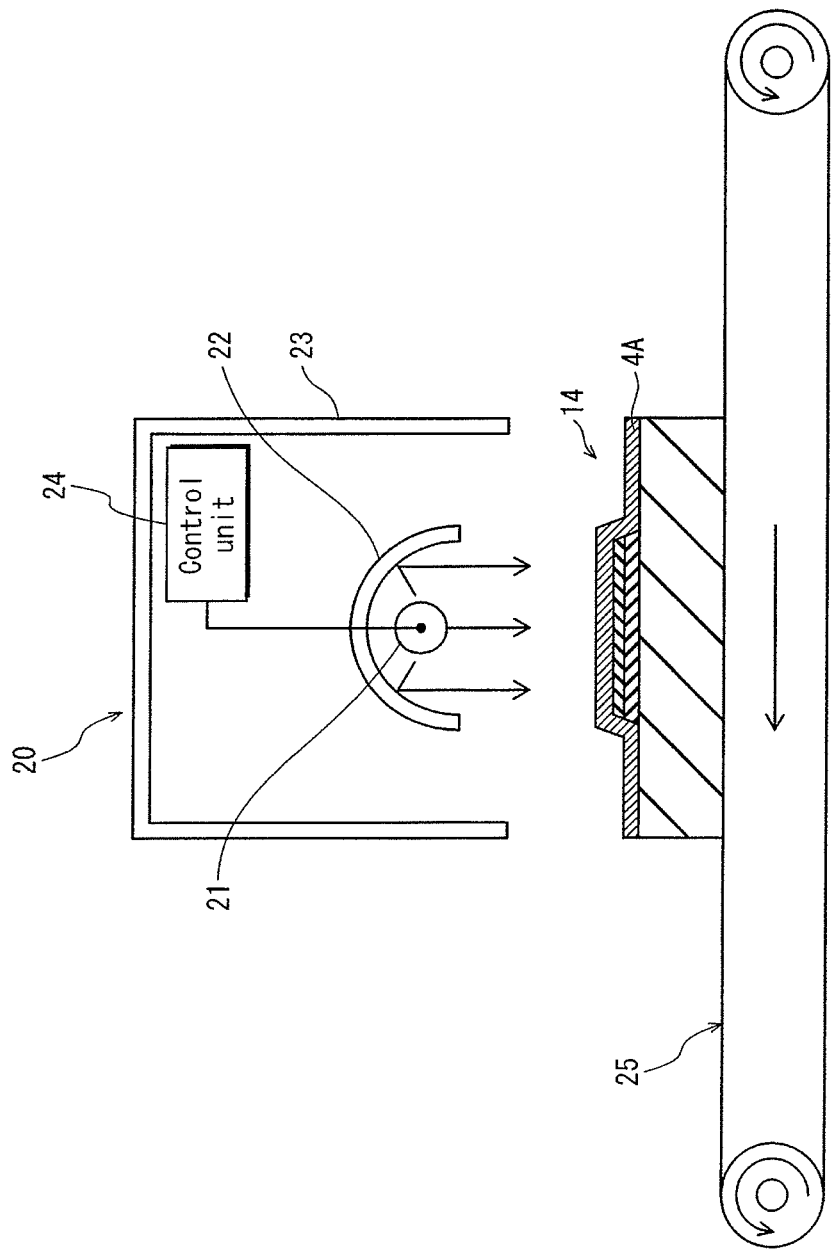
FIG. 10 is a view for explaining a UV irradiation step.

For example, as illustrated in FIG. 10, the surface of the thin film 4A in the intermediate product 14 illustrated in FIG. 8B is irradiated with ultraviolet light by using, for example, an ultraviolet (UV) irradiation apparatus 20 having a metal halide lamp manufactured by Ushio Inc. (Model No.: UVL-3000M2-N) as a light source 21. The irradiation conditions are separately determined by experiments conducted using photoemission spectroscopy measurements, which will be described later. Specifically, the irradiation conditions are determined so that changes in shape of the resulting photoelectron spectrum in a spectral region corresponding to a predetermined binding energy range converge. In this embodiment, the irradiation intensity is determined to be 155 mW/cm$^2$ and the irradiation duration is determined to be 10 minutes. The UV irradiation apparatus 20 will be described later in detail.

(Effects Achieved by Manufacturing Method of Organic EL Element)

The above-described manufacturing method of the organic EL element 10 involves the UV irradiation step of radiating ultraviolet light having the predetermined wavelength, performed after the hole injection layer 4 of tungsten oxide is formed. With the step, adherents on the surface of the hole injection layer 4 are removed, while the energy level resulting from oxygen vacancies or similar structures present in tungsten oxide is maintained on the hole injection layer surface.

Furthermore, the energy level mentioned above is continuously maintained in the atmosphere throughout the time from the cleaning of the hole injection layer 4 to the formation of the functional layer. Consequently, the ability of hole injection is maintained with stability. This ensures the stable manufacturing of the organic EL element 10 that is driven with low drive voltage and has longevity.

Furthermore, the duration of UV irradiation and the intensity of ultraviolet light in the UV irradiation step are determined in view of the conditions with which, in a photoelectron spectrum exhibited by the hole injection layer 4, changes in shape of a spectral region corresponding to a predetermined binding energy range converge. That is, the irradiation conditions are determined to achieve the maximum removable of adherents with the minimum conditions. Thus, the highly stable hole injection efficiency is realized with a minimum cleaning process.

(Ultraviolet Irradiation Apparatus)

In the following, description is provided on an UV irradiation apparatus. FIG. 10 illustrates an UV irradiation apparatus 20 that is for irradiating ultraviolet light to the intermediate product 14 of the organic EL element 10 and that includes: a light source 21 that emits ultraviolet light mainly within the wavelength region longer than 184.9 nm and equal to 380 nm or shorter; a reflector 22 that reflects ultraviolet light emitted by the light source 21 toward the intermediate product 14; a housing 23 that houses the light source 21 and the reflector 22 to hold them in place; and a control unit 24 that controls ON/OFF of the light source 21.

The intermediate product 14 has, for example, the anode 2 and the thin layer 4A composed of tungsten oxide layered on the substrate 1 but still does not have the light-emitting layer 6 formed therein.

The light source 21 is, for example, a straight metal halide lamp disposed to longitudinally coincide with the widthwise direction of the intermediate product 14 being transferred. The light source 21 is operated to emit light under the conditions suitable for effective manufacturing of organic EL elements capable of emitting light at high intensity and low electrical consumption. The conditions of UV irradiation, such as irradiation duration and irradiation intensity, are determined based on various factors, including the film-forming conditions of the thin film 4A and the convergence of changes in shape in a photoelectron spectroscopy spectrum exhibited by the thin film 4A as described in the present embodiment. The irradiation conditions are set by the operator. Alternatively, the irradiation conditions may be automatically set by the control unit 24. For example, the control unit 24 stores a database in which layer forming conditions, irradiation durations, and irradiation intensities are correlated. On receiving input of the layer forming conditions by the operator, the control unit 24 sets the irradiation duration and intensity with reference to the database.

The intermediate product 14 is transported to the position for UV irradiation by a conveyer 25. In the figure, the intermediate product 14 placed onto the conveyer 25 from the upstream (right-hand side of the figure) in the transport direction is transported by the conveyer 25 to pass the position for receiving UV irradiation. While the intermediate product 14 is passing the position, a predetermined amount of ultraviolet light is applied to the upper surface of the intermediate product 14, i.e., the upper surface of the thin film 4A. Having been irradiated with ultraviolet light, the intermediate product 14 is transported out to the downstream (left-hand side of the figure).

In the UV irradiation apparatus 20 described above, the light source 21 is not limited to a metal halide lamp. Alternately, the light source 21 may be any light source capable of emitting ultraviolet light mainly within the wavelength region longer than 184.9 nm and equal to 380 nm or shorter (for example, longer than 253.7 nm and equal to 380 nm or shorter).

<Experiments and Observations>

With the aim of preventing increase in drive voltage of the organic EL element and reduction in longevity of the organic EL element, the present inventors have come to a technical idea of adding, to the manufacturing steps, a cleaning step of removing adherents from the layer surfaces subsequent to the formation of the respective layers.

As the cleaning methods for removing adherents, the present inventors have turned their attention to ultraviolet (UV) ozone cleaning and oxygen plasma cleaning, which are widely used for cleaning glass substrates and electrodes, for the high degree of cleanliness achieved thereby. Intensive studies by the present inventors on the cleaning methods have revealed that neither UV ozone cleaning nor oxygen plasma cleaning is suitable for cleaning the hole injection layer of an organic EL element, provided that the hole injection layer is composed of tungsten oxide.

The reason is as follows. Both the UV ozone cleaning and oxygen plasma cleaning utilize strong oxidation associated with oxygen radicals formed by decomposition of oxygen molecules. Through the oxidation, oxygen atoms end up filling oxygen vacancies or similar structures present in tungsten oxide on the surface of the hole injection layer. Consequently, the energy level resulting from oxygen vacancies or similar structures disappears from the hole injection layer composed of tungsten oxide. As a result, there is a risk of decreasing the hole injection efficiency. To be more precise, the present inventors have confirmed, by experiments described below, that the energy level resulting from oxygen vacancies or similar structures almost completely disappears through UV ozone cleaning.

Based on the above findings, the present inventors have recognized the importance of the following two points in order to prevent increase in the drive voltage of, and decrease in the longevity of an organic EL element having a hole injection layer composed of tungsten oxide. One of the points is that the energy level resulting from oxygen vacancies or similar structures present in tungsten oxide on the surface of the hole injection layer remains without being eliminated. The other of the points is that adherents are removed from the surface the hole injection layer.

After a series of researches and studies regarding the above-described features of the present invention, the present inventors came to be aware of Non-Patent Literature 1 disclosing UV ozone cleaning performed subsequent to the formation of a hole injection layer composed of tungsten oxide. However, Non-Patent Literature 1 discloses nothing about the impact on the characteristics of the organic EL element imposed by UV ozone cleaning and nothing about optimizing the conditions of UV ozone cleaning. It is further noted that Non-Patent Literature 1 does not describe anything about the fact, which are found by the present inventors through specific studies, that UV ozone cleaning is not suitable for cleaning a hole injection layer containing tungsten oxide unless adequately modified. Naturally, Non-Patent Literature 1 does not describe anything about the technical reasons for the unsuitability.

As another method for removing adherents, the following discusses sputter etching of performing argon ion sputtering in a vacuum chamber subsequent to formation of a hole injection layer. The sputter etching has been reported to remove adherents and also to increase the energy level resulting from oxygen vacancies or similar structures. Thus, the sputter etching appears to be an excellent cleaning method at first.

Unfortunately, the adherent removal effect and the increased energy level obtained by the sputter etching can be maintained only in the vacuum chamber for the following reason. That is, the surface of a hole injection layer treated by sputter etching in vacuum is highly instable because the molecular bonds have been forcedly broken by an ion beam. Therefore, once taken out of the vacuum chamber, the hole injection layer easily adsorbs atmospheric molecules to be stabilized. In the manner described above, oxygen vacancies or similar structures present in tungsten oxide which are forcedly created in a vacuum are instantly filled, and the layer surface once cleaned rapidly adsorbs contaminants.

The layer surface may be kept clean by performing some or all of the manufacturing steps subsequent to the sputter etching continuously inside the vacuum chamber. However, performing manufacturing steps inside a vacuum chamber is applicable, on condition that the organic EL panel to be manufactured is relatively small. For a large-sized organic EL panel having display size of e.g., around 50 inches, it is extremely difficult to perform the manufacturing steps inside a vacuum chamber as the vacuum chamber needs to be large enough for such a large-sized organic EL panel. Besides, the throughput of steps performed inside a vacuum chamber is small, and such steps are not desirable for mass production.

Alternatively to removing adherents, a method of preventing adhesion of contaminants per se is one possibility. For example, by performing some or all of manufacturing steps subsequent to the layer formation continuously inside a vacuum chamber, the respective layers are exposed neither to the atmosphere nor to impurity molecules. Thus, the layer surface is kept free or substantially free of contaminants. However, this scheme is extremely difficult to apply to the manufacturing of large-sized organic EL panels because the vacuum chamber of a corresponding size is required as already described above.

Alternatively, performing manufacturing steps inside a chamber filled with inert gas is another possibility. This scheme is applicable to the manufacturing of large-sized organic EL panels. Unfortunately, such a chamber still contains impurity molecules and the like, although the amount is smaller than that in the atmosphere. In addition, complete removal of such molecules from the chamber is difficult.

As has been described above, it is extremely difficult to obtain an organic EL element having a hole injection layer satisfying that (i) the energy level resulting from oxygen vacancies or similar structures present in tungsten oxide on the layer surface remains without being eliminated and (ii) the surface of the hole injection layer is free or substantially free of adherents.

In contrast, an organic EL element according to one aspect of the present invention includes a hole injection layer having an energy level resulting from oxygen vacancies or similar structures present in tungsten oxide on the surface of the hole injection layer remaining without being eliminated. Therefore, holes are injected from the anode to the functional layer with efficiency. Consequently, the organic EL element emits light at low power consumption and high intensity. In addition, since adherents have been removed from the surface of the hole injection layer, no or substantially no contaminants are embedded between the hole injection layer and the functional layer. As a consequence, the drive voltage of the organic EL element is not increased and no carrier traps, such as impurities derived from adherents, are formed, which ensures a long life and favorable characteristics of the organic EL element.

(1) Effect of Adherent Removal by UV Irradiation

According to this embodiment, subsequent to its formation, the hole injection layer 4 composed of tungsten oxide is exposed to ultraviolet light under the predetermined conditions, whereby adherents are removed from the surface of the hole injection layer 4. The adherent removal effect achieved by the UV irradiation is confirmed by the following experiments.

According to the manufacturing method according to the present embodiment, samples were prepared each by laminating the anode 2 composed of ITO on the substrate 1, and the hole injection layer 4 composed of tungsten oxide on the anode 3, in the chamber of the sputtering film-forming apparatus. After the lamination, each intermediate sample was taken out of the chamber to the atmosphere to prepare a sample without any UV irradiation, a sample with UV irradiation for one minute, and a sample with UV irradiation for ten minutes. The irradiation intensity was 155 mW/cm$^2$.

In the following description in the present embodiment, a sample without UV irradiation may be referred to as a "no-irradiation sample" and a sample with UV irradiation for n minutes may be referred to as an "n-minute irradiation sample".

Each sample was then attached to a photoelectron spectroscopy apparatus (PHI 5000 VersaProbe) manufactured by ULVAC-PHI, and X-ray photoelectron spectroscopy (XPS) measurement was performed. Generally, an XPS spectrum indicates an elemental composition, a binding condition, and a valence of the target surface up to several nanometers in depth. That is, if elements not originally contained in tungsten oxide are observed, it is highly likely that the elements are adherents. In addition, it is generally known that molecules adhering as a result of atmospheric exposure or during manufacturing steps are mainly carbon-containing molecules, if water molecules and oxygen molecules are excluded from consideration. Therefore, the adherent removal effect achieved is confirmed by measuring changes in the carbon concentration in the surface region of the hole injection layer 4.

The conditions under which the XPS measurement was conducted are as follows. Note that no charge-up occurred during the measurement.

Light source: Al Kα

Bias: None

Electron emission angle: Normal line direction of the substrate surface

First, each sample was subjected to wide-scan measurement. As a result of the measurement, the only elements found in each sample were tungsten (W), oxygen (O), and carbon (C). Then, narrow-scan spectra of each sample were measured for the W 4f orbital (W4f) and also for the C 1s orbital (C1s) to obtain the relative value of the number density of carbon atoms to the number of density of tungsten atoms present in the surface region up to several nanometers in depth of the hole injection layer 4 composed of tungsten oxide. That is, the composition ratio between W and C was obtained. The composition ratio was obtained from the spectra, by using the composition ratio calculation function of "MultiPak" XPS, which is analyzing software included with the photoelectron spectroscopy apparatus used in the measurements.

Table 1 below shows the composition ratio between W and C of each sample.

TABLE 1

| Sample Name | Composition Ratio between W and C (W:C) |
|---|---|
| No-Irradiation Sample | 1:1.27 |
| 1-Minute Irradiation Sample | 1:0.83 |
| 10-Minute Irradiation Sample | 1:0.62 |

With reference to Table 1, the number of carbon atoms relative to the number of tungsten atoms decrease more and more as the irradiation duration extends, which is apparent when comparing the sample without irradiation against the sample with 1-minute irradiation and the sample with 10-minute irradiation. That is, it is made clear that the UV irradiation according to the present embodiment serves to decrease adherents on the surface of the hole injection layer 4 composed of tungsten oxide.

(Influences of UV Irradiation on Hole Injection Ability)

According to the present embodiment, the UV irradiation is performed to remove adherents from the surface of the hole injection layer 4 composed of tungsten oxide, in a manner that the energy level resulting from oxygen vacancies or similar structures present in tungsten oxide is maintained without any substantial influence. Note that oxygen vacancies or similar structures present in tungsten dioxide favorably affect the hole injection ability. This property of maintaining oxygen vacancies or similar structures present in tungsten oxide is confirmed by the following experiments.

In the experiments, the above-described samples without irradiation, with 1-minute irradiation, and with 10-minute irradiation were subjected to UPS (ultraviolet photoelectron spectroscopy) measurements. Generally, a UPS spectrum indicates the electronic state, from the valence band to the Fermi surface (Fermi level), of the measurement target surface of up to several nanometers in depth. Especially in the case where the measurement target is tungsten oxide or molybdenum oxide, the presence of oxygen vacancies or similar structures on the layer surface is indicated by a protrusion appearing, in a UPS spectrum, near the Fermi surface in the low binding energy direction from the top of the valence band (hereinafter, such a protrusion is referred to as a "spectral protrusion near the Fermi surface") (Non-Patent Literature 2 and 3). In tungsten oxide, the spectral protrusion near the Fermi surface occupies a binding energy range that extends from 1.8 eV lower than the top of the valence band to 3.6 eV lower than the top of the valence band (the lowest binding energy within the valence band).

The conditions under which the UPS measurement was conducted are as follows. Note that no charge-up occurred during the measurement.

Figure 11:
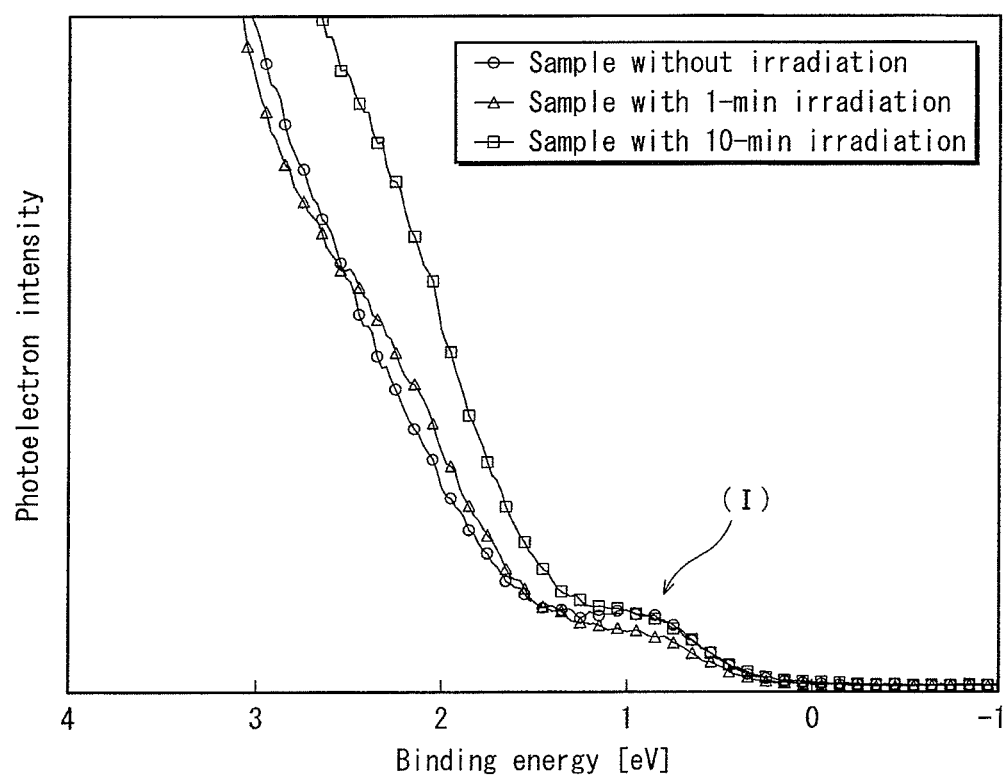
FIG. 11 illustrates UPS spectra of tungsten oxide.

Light source: He I
Bias: None
Electron emission angle: Normal line direction of the substrate surface FIG. 11 shows the UPS spectra of the respective samples, focusing on portions near the Fermi surface. In the following description, each photoelectron spectroscopy spectrum (UPS and XPS) is shown such that the reference point on the horizontal axis, indicating binding energy, corresponds to the Fermi surface and such that the left direction with respect to the reference point is positive, and the right direction with respect to the reference point is negative. In all the spectra measured on the samples without irradiation, with 1-minute irradiation, and with 10-minute irradiation, a spectral protrusion near the Fermi surface is clearly observed. In the figure, spectral protrusions near the Fermi surface are collectively denoted by (I). These results indicate that oxygen vacancies or similar structures present in tungsten oxide, which favorably affect the hole-injection ability, are maintained even after the UV irradiation.

For the purpose of comparison, UV ozone cleaning was also performed. More specifically, samples were prepared each by laminating the anode 2 composed of ITO on the substrate 1, and the hole injection layer 4 composed of tungsten oxide on the anode 4, in the chamber of a sputtering film-forming apparatus. The intermediate samples were than taken out of the chamber to the atmosphere, followed by UV ozone cleaning of the surface of the hole injection layer 4 by a UV ozone apparatus. The samples after the UV ozone cleaning were subjected to UPS measurement to check the presence of a spectral protrusion near the Fermi surface.

Figure 12:
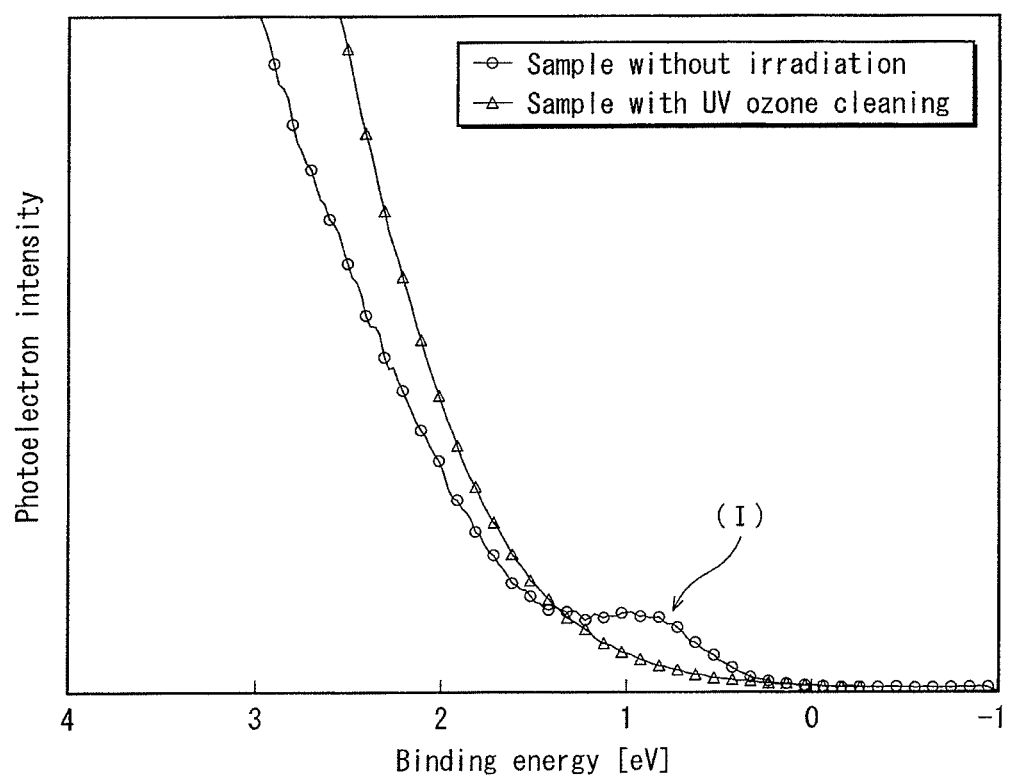
FIG. 12 illustrates UPS spectra of tungsten oxide.

FIG. 12 illustrates the UPS spectrum of the hole injection layer 4 composed of tungsten oxide having been subjected to the UV ozone cleaning for three minutes, focusing on a portion near the Fermi surface. For the purpose of comparison, FIG. 12 also illustrates the UPS spectrum of the sample without irradiation, which is illustrated in FIG. 11. Unlike the results shown in FIG. 11 regarding the samples subjected to the UV irradiation according to the present embodiment, no spectral protrusion near the Fermi surface is observed at all. The results indicate that through the UV ozone cleaning, almost all oxygen vacancies or similar structures are lost from the surface of the hole injection layer 4.

As described above, it is clarified that cleaning by the UV irradiation according to the present embodiment is different from the UV ozone cleaning in that oxygen vacancies or similar structures are maintained without being lost. That is, oxygen vacancies or similar structures, which favorably affect the hole injection ability, are not eliminated by the UV irradiation.

(2) Method for Determining UV Irradiation Conditions

According to the present embodiment, the surface of the hole injection layer 4 composed of tungsten oxide is cleaned by UV irradiation. It is confirmed by the following experimental results that the adherent removal effect becomes saturated when irradiation is performed for a specific duration or longer.

Figure 13:
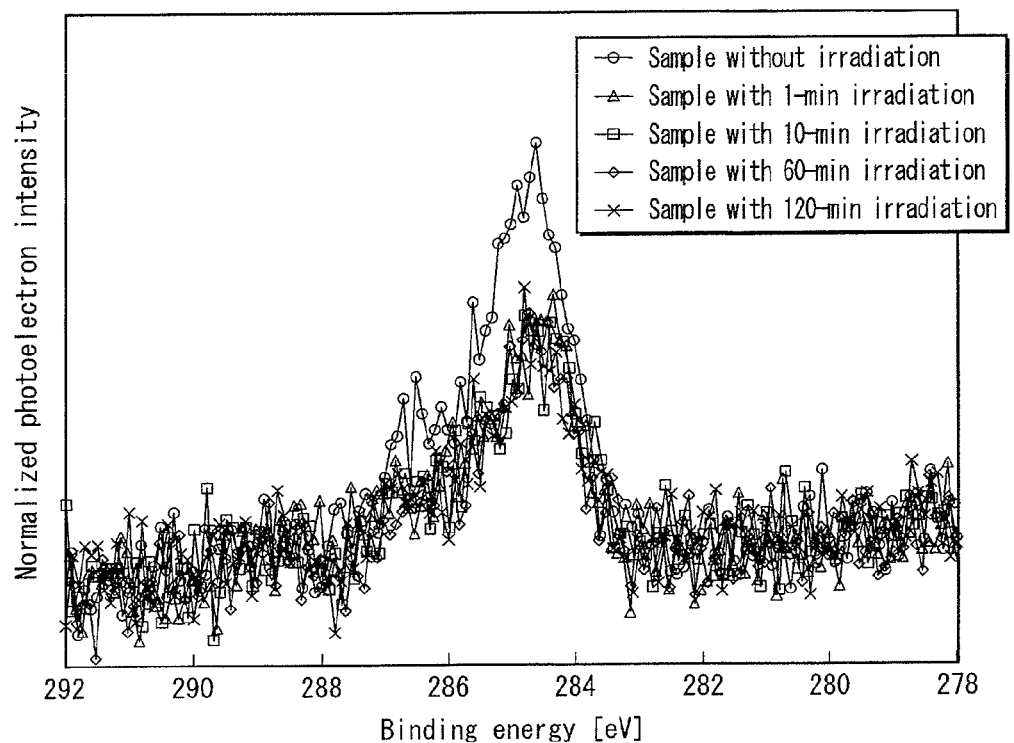
FIG. 13 illustrates XPS spectra of tungsten oxide.

In the same manner as described above, samples without irradiation, with 1-minute irradiation, and with 10-minute irradiation were prepared. In addition, samples with 60-minute irradiation and 120-minute irradiation were prepared. Then, narrow-scan spectra for W4f and C1s of the respective samples were measured by XPS measurement. From the respective spectra, background components were subtracted. Then, the photoelectron intensity was normalized using the area intensity of the narrow-scan spectrum for W4f. The narrow-scan spectra for C1s of the respective samples are shown in FIG. 13. The area intensity of each C1s spectrum illustrated in FIG. 13 is proportional to the ratio of the number density of carbon atoms to the number density of tungsten atoms, which were present in the surface region of the hole injection layer 4 composed of tungsten oxide up to several nanometers in depth from the layer surface.

According to FIG. 13, the C1s spectra measured on the samples with 1-minute irradiation or longer are all substantially equal in intensity. This indicates that the adherent removal effect has substantially reached a level of saturation when irradiation was performed for the duration of one minute or longer.

Generally, a C1s spectrum tends to be low in intensity and roughly irregular as shown in FIG. 13, because the absolute amount of adherents is intrinsically small. Therefore, C1s spectra may not be the most suitable in determining saturation of the adherent removal effect. In view of this, the following describes other methods involving the use of spectra of relatively strong intensity, for determining saturation of the adherent removal effect.

The first of such a method is to make a saturation determination based on changes in the shape in a UPS spectral region corresponding to a range of binding energy around the top of the valence band, or that is, changes in the shape of the UPS spectral region corresponding to the binding energy range from 4.5 eV to 5.4 eV. A peak or shoulder appearing in this spectral region indicates a lone pair of electrons in the 2p orbital in oxygen atoms constituting tungsten oxide.

Figure 14:
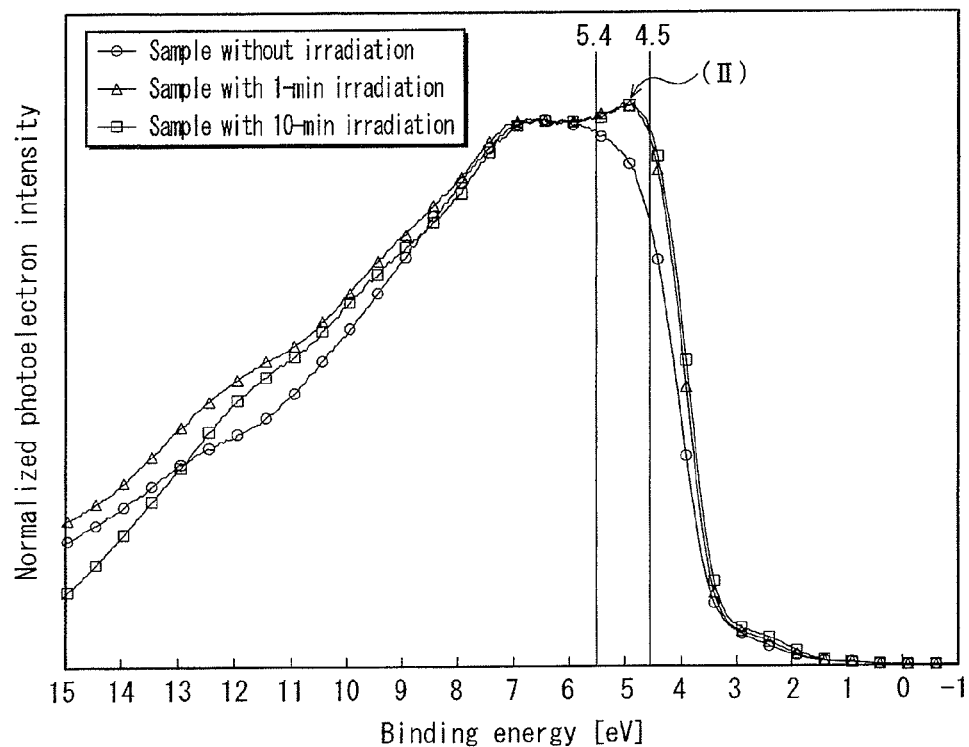
FIG. 14 illustrates UPS spectra of tungsten oxide.

FIG. 14 illustrates the UPS spectra. UPS measurements were made on the respective samples without irradiation, with 1-minute irradiation, and with 10-minute irradiation. The photoelectron intensity is normalized using a gentle peak appearing around the binding energy of 6.5 eV. As shown in FIG. 14, the spectra measured on samples with 1-minute irradiation and with 10-minute irradiation both have a clear peak (denoted by (ii) in the figure) appearing in the binding energy range from 4.5 eV to 5.4 eV. Such a peak does not appear in the spectrum measured on the sample without irradiation. In addition, the respective spectra measured on samples with 1-minute irradiation and with 10-minute irradiation are substantially identical in the shape of the peak. This means that changes in the UPS spectral shape within the binding energy range from 4.5 eV to 5.4 eV substantially converge when irradiation is performed for the duration of one minute or longer. This behavior is similar to that observed in C1s spectra. In addition, this behavior is assumed to indicate, similar as in C1s spectra, that the adherent removal effect is obtained by UV irradiation and that the effect becomes saturated with when irradiation is performed for the duration of one minute or longer.

Figure 15:
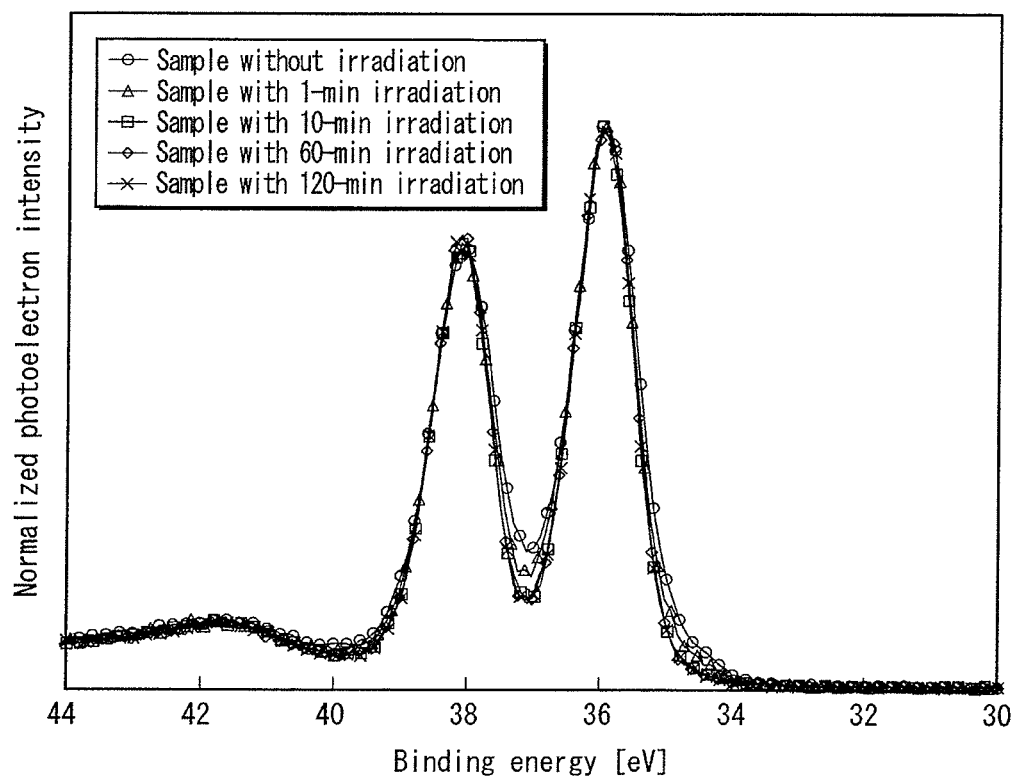
FIG. 15 illustrates XPS spectra of tungsten oxide.

The second one of such a method makes a saturation determination based on changes in the W4f spectral shape of XPS measurements. FIG. 15 shows W4f spectra measured on the respective samples without irradiation, with 1-minute irradiation, with 10-minute irradiation, with 60-minute irradiation, and with 120-minute irradiation. The spectra are normalized using the maximum and minimum values.

As shown in FIG. 15, each of the samples with irradiation exhibits a peak sharper (i.e., the half-width of each peak is smaller) than a peak exhibited by the samples without irradiation. In addition, the peak shape is slightly sharper for the sample with 10-minute irradiation than for the sample with 1-minute irradiation. Yet, for the samples with 10-minute irradiation, with 60-minute irradiation, and with 120-minute irradiation, the spectra coincide substantially entirely. This means that changes in the spectral shape converge for any samples with irradiation performed for the duration of ten minutes or longer.

Such changes in shape of W4f spectra resulting from different irradiation durations are explained in the following way, for example. Although depending upon the structure of adherents, when adherents supply negative charges to tungsten atoms present on the layer surface, the binding energy of the inner-shell orbital W4f shifts in the low binding energy direction according to the negative charges. Chemically speaking, some of hexavalent tungsten atoms present on the layer surface of tungsten oxide change into lower-valent atoms, such as pentavalent atoms. In the XPS spectrum for W4f, this energy level shift is observed as a broader spectral shape. Such a relatively broad spectral shape is exhibited because the spectrum for hexavalent tungsten atoms, which make up the majority, overlaps with the spectrum for lower-valent tungsten atoms, which make up a small proportion.

In view of the above, with respect to the spectra illustrated in FIG. 15, it is assumed that the peak is sharper in shape because the removal of adherents by the UV irradiation alters pentavalent tungsten atoms back into hexavalent atoms. From the above observation, it is understood that most of the adherents are removed by the UV irradiation performed for one minute and that the adherent removal effect has reached a level of saturation when the UV irradiation is performed for ten minutes or longer. This behavior is similar to that observed on C1s.

In addition, although not illustrated in the figure, it is confirmed that the changes in the shape of the spectra for O1s orbital of oxygen atoms converge when the UV irradiation is performed for ten minutes or longer.

From the above, the adherent removal effect achieved by the UV irradiation according to the present embodiment becomes saturated when the UV irradiation is performed for a certain duration or longer. As such, the irradiation conditions are determined as follows. For example, the irradiation duration is determined by measuring, with respect to any specific irradiation intensity, the time required for changes in the shape in the narrow-scan spectrum for W4f or O1s in XPS measurement to converge or for changes in the shape of the UPS spectral region corresponding to the binding energy range from 4.5 eV to 5.4 eV to converge. The time thus measured is determined as the irradiation duration. More specifically, a spectrum measured after UV irradiation for n minutes is compared with a spectrum measured after UV irradiation for (n+1) minutes to obtain the difference between the two spectra at each of a plurality of measurement points. If the root-mean-square of the differences in the normalized intensity becomes equal to a specific value or smaller, it is then determined that the changes in the spectral shape converge when the irradiation duration is n-minutes and thus the maximum level of adherent removal has been completed. In this embodiment, it is determined from FIGS. 14 and 15 that the adherent removal effect becomes saturated when UV irradiation is performed for ten minutes.

(3) Maintaining Electronic State After UV Irradiation

According to the present embodiment, the energy level resulting from oxygen vacancies or similar structures, which favorably affect the hole-injection ability, is maintained at least throughout the time from the surface cleaning until another layer is formed on the cleaned surface. The grounds are as follows.

The UPS spectra shown in FIG. 11 described above were measured two days after the UV irradiation. That is, between the samples without irradiation and the samples with the respective irradiation durations that were left to stand in the atmosphere for two days after the UV irradiation, there is no notable difference in the spectral protrusion near the Fermi surface of the UPS spectra. In each UPS spectrum, the spectral protrusion is clearly observed. In addition, although not illustrated in the figures, measurements were made on samples two hours after the UV irradiation and one day after the UV irradiation. In these measurements, the spectral protrusion near the Fermi surface was clearly observed in each spectrum in a manner similar to FIG. 11. That is to say, it is confirmed that the energy level resulting from oxygen vacancies or similar structures are maintained in the atmosphere at least for two days after the UV irradiation.

This time period of two days is sufficiently long as compared with the interval; between the step of cleaning the hole injection layer 4 by UV irradiation and the step of laminating the buffer layer 13 on the hole injection layer 4 (note that the interval between the two step is commonly a few hours). That is, unless the step of forming the buffer layer 13 is intentionally delayed, it is unlikely that the buffer layer 13 is not formed until after this two-day period.

(4) Improvement in Element Characteristics by UV Irradiation

The organic EL element 10 pertaining to the present embodiment manufactured incorporating the step of cleaning the hole injection layer 4 by UV irradiation exhibits better characteristics compared with an organic EL element manufactured without UV irradiation. Such characteristics are confirmed by the following experiments.

First, the inventors prepared hole-only devices as assessment devices to be used in accurately determining the effect on the hole injection efficiency of the hole injection layer 4, in injecting holes into the buffer layer 13, achieved by removing adherents from the surface of the hole injection layer 4 by UV irradiation.

Generally, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 16:
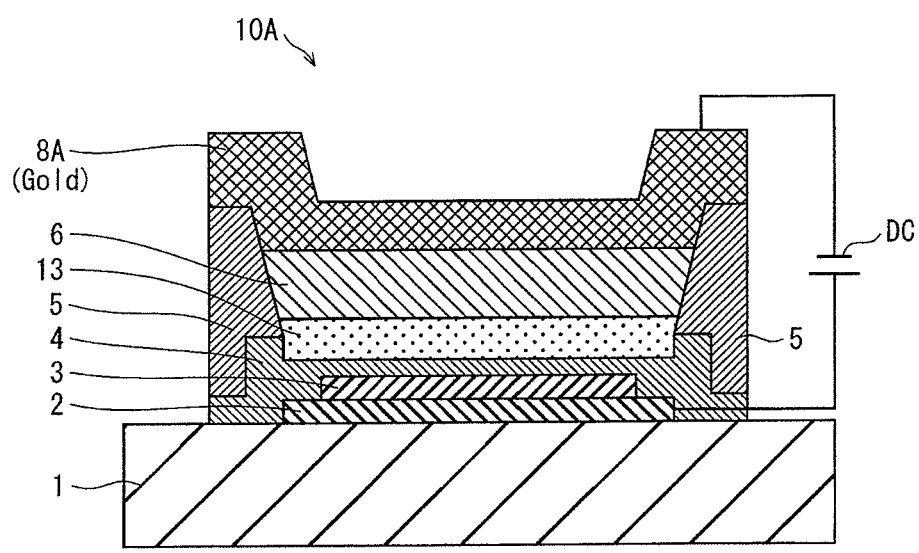
FIG. 16 is a schematic cross-sectional view illustrating a structure of a hole-only device.

In detail, the hole-only devices 10A prepared were actually prepared by replacing the cathode 8 of the organic EL element 10 illustrated in FIG. 7 with gold (Au) to form a cathode 8A as illustrated in FIG. 16. Specifically, by following the manufacturing method of the organic EL element 10 according to the present embodiment, and as illustrated in FIG. 16, the anode 2 composed of a 50 nm-thick ITO thin film is formed on the substrate 1 according to a sputtering method. Then, the hole injection layer 4 composed of a 30 nm-thick tungsten oxide film is formed on the anode 2, by a predetermined sputtering method in a manner that the layer surface is provided with the energy level resulting from oxygen vacancies or similar structures. Then, the buffer layer 13 composed of a 20 nm-thick layer of TFB, which is an amine-containing organic polymer, is formed on the hole injection layer 4, and the light-emitting layer 6 composed of a 70 nm-thick layer of F8BT, which is an organic polymer, is formed. Finally, the cathode 8A composed of a 100 nm-thick layer of gold is formed on the light-emitting layer 6.

Note that two hole-only devices 10A were prepared. In one of the hole-only devices 10A, the hole injection layer 4 was subjected to UV irradiation according to the present embodiment (for the irradiation duration of 10 minutes) after being formed and being taken out of the chamber of the sputtering film-forming apparatus into the atmosphere (adsorption of adherents takes place at this point). In the other of the hole-only devices 10A, the hole injection layer 4 was not subjected to UV irradiation after being formed and being taken out of the chamber into the atmosphere. Hereinafter, the former hole-only device 10A is referred to as "HOD with irradiation", whereas the latter hole-only device 10A is referred to as "HOD without irradiation".

Each of the hole-only devices 10A thus prepared was then connected to the direct current power source DC and voltage was applied thereto. Further, the inventors obtained an electric current value per unit surface area (current density) for each of the hole-only devices 10A. More specifically, the voltage applied to the hole-only devices 10A was changed, and a value indicating electric current flowing was obtained at different voltages. Further, conversion was performed on the electric current values to obtain an electric current density value of the hole-only devices 10A. Note that hereinafter, a voltage applied to obtain a current density value of 0.4 mA/cm$^2$ is referred to as a "drive voltage".

In short, it could be said that the smaller the drive voltage, the higher the hole injection efficiency of the hole injection layer 4 is. That is, the members composing the hole-only devices 10A, other than the hole injection layer 4, were prepared according to the same manufacturing method. Thus, it could be assumed that the hole injection barrier between two adjacent layers, other than that between the hole injection layer 4 and the buffer layer 13, is uniform in the hole-only devices 10A. Considering the above, the differences in drive voltage of the hole-only devices 10A resulting from whether or not UV irradiation was performed with respect to the surface of the hole injection layer 4 closely reflects the hole injection efficiency from the hole injection layer 4 to the buffer layer 13.

Table 2 illustrates each of the hole-only devices 10A and a drive voltage thereof.

TABLE 2

| Sample Name | Drive Voltage |
|---|---|
| HOD with Irradiation | 18.9 V |
| HOD without Irradiation | 19.7 V |

Figure 17:
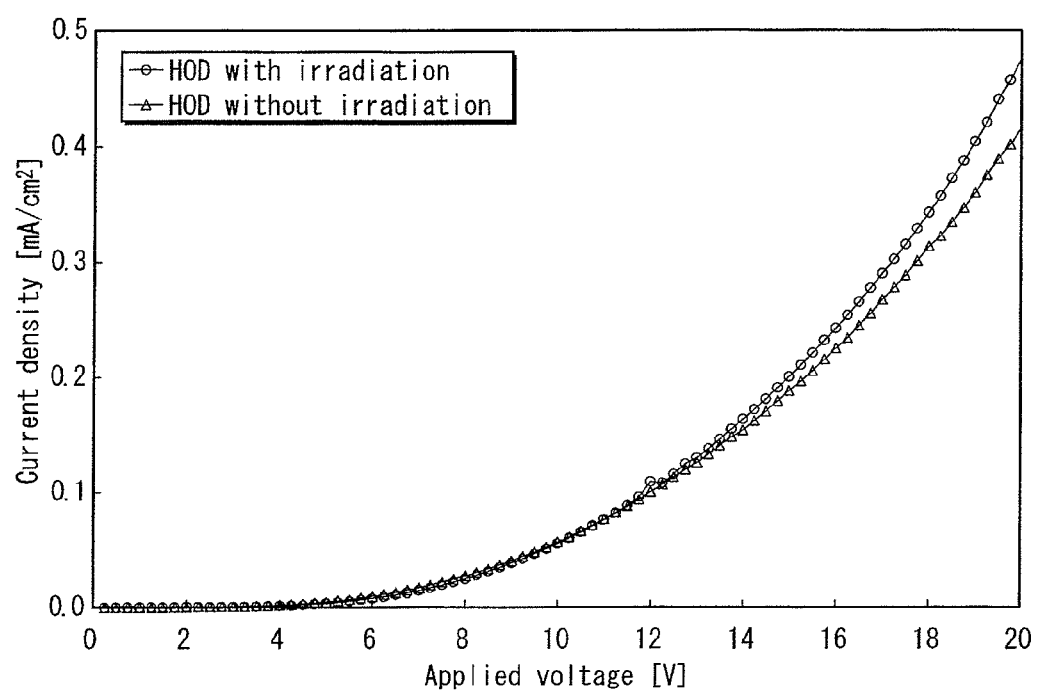
FIG. 17 is a device characteristics diagram of relation curves each illustrating a relation between applied voltage and electric current density of a hole-only device.

In addition, FIG. 17 illustrates an electric current density-applied voltage curve of each of the hole-only devices 10A. In FIG. 17, the vertical axis indicates electric current density (mA/cm$^2$), whereas the horizontal axis indicates applied voltage (V).

As shown in Table 2 and FIG. 17, when comparing the HOD with irradiation to the HOD without irradiation, the drive voltage is lower and the rising of the electric current density-applied voltage curve is quicker for the HOD with irradiation. Further, it could be seen that the HOD with irradiation requires for a lower level of applied voltage to reach a high electric current density, compared with the HOD without irradiation. That is, the HOD with irradiation has a higher degree of hole injection efficiency compared with the HOD without irradiation.

In the above, observation has been made of the hole injection efficiency of the hole injection layer 4 in each of the hole-only devices 10A. However, it should be emphasized that the hole-only devices 10A and the organic EL element 10 illustrated in FIG. 7 have nearly the same structure, differing only in that the cathode 8A is included in the hole-only devices 10A. That is, the organic EL element 10 is essentially the same as the hole-only devices 10A in terms of the effect imposed by the adherent removal by the UV irradiation on the hole injection efficiency from the hole injection layer 4 to the buffer layer 13.

In order to confirm the above, two samples of the organic EL element 10 were prepared. One of the samples was prepared using the hole injection layer 4 being subjected to UV irradiation, and the other of the samples was prepared using the hole injection layer 4 not being subjected to UV irradiation. Hereinafter, the former sample of the organic EL element 10 is referred to as "BPD with irradiation", whereas the latter is referred to as "BPD without irradiation". Except that the hole injection layer 4 of the BPD without irradiation was not exposed to UV light, the BPDs were manufactured by the manufacturing method according to the present embodiment.

Each sample organic EL apparatus 10 (i.e., each of the BPDs) thus prepared was connected to the direct current power source DC, and voltage was applied thereto. Further, the inventors obtained an electric current value per unit surface area (current density) for each of the BPDs. More specifically, the voltage applied to the BPD was changed, and a value indicating electric current flowing was obtained at different voltages. Further, conversion was performed on the electric current values to obtain an electric current density value of the BPDs. Note that hereinafter, a voltage applied to obtain a current density value of 10 mA/cm² is referred to as a "drive voltage".

Table 3 illustrates each of the sample organic EL elements 10 and a drive voltage thereof

TABLE 3

| Sample Name | Drive Voltage |
|---|---|
| BPD with Irradiation | 8.3 V |
| BPD without Irradiation | 9.2 V |

Figure 18:
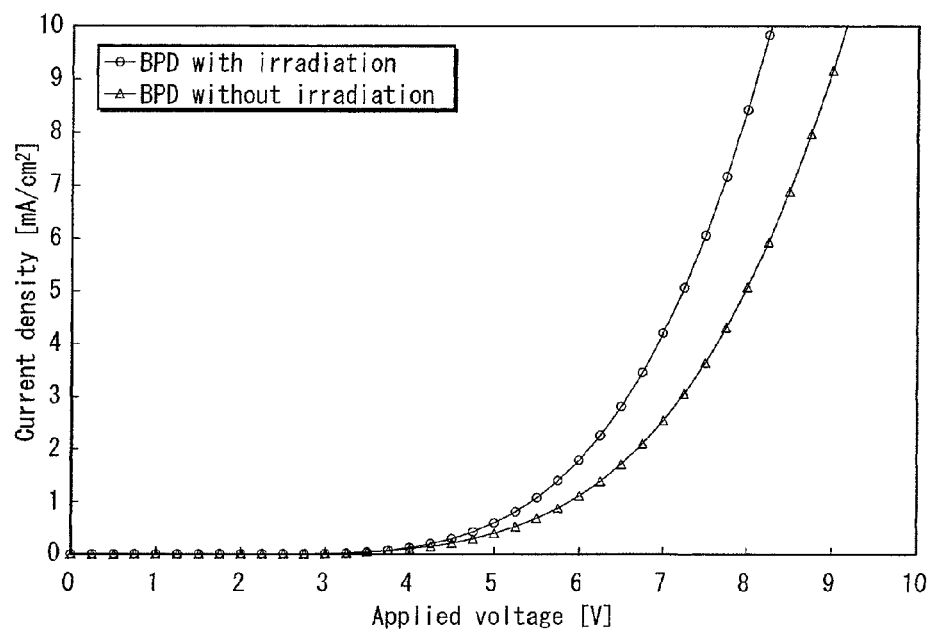
FIG. 18 is a device characteristics diagram of relation curves each illustrating a relation between applied voltage and electric current density of an organic EL element having been prepared.

In addition, FIG. 18 illustrates an electric current density-applied voltage curve of each of the sample organic EL elements 10A. In FIG. 18, the vertical axis indicates electric current density (mA/cm²), whereas the horizontal axis indicates applied voltage (V).

As shown in Table 3 and FIG. 18, when comparing the BPD with irradiation to the BPD without irradiation, the drive voltage is lower and the rising of the electric current density-applied voltage curve is quicker for the BPD with irradiation. Further, it could be seen that the BPD with irradiation requires for a lower level of applied voltage to reach a high electric current density, compared with the BPD without irradiation. This tendency is the same as that observed with the HOD with irradiation and HOD without irradiation.

By the above experiments, it was confirmed that, regarding the sample organic EL elements 10, the effect imposed on the hole injection efficiency from the hole injection layer 4 to the buffer layer 13 by the removal of adherents by UV irradiation to the surface of the hole injection layer 4 is similar to that confirmed with the hole-only devices 10A.

By the above experiments, the following is confirmed. That is, by UV irradiation performed in a predetermined manner according to the present embodiment after the hole injection layer 4 is formed, adherents are removed to the maximum extent from the surface of the hole injection layer 4 without affecting the energy level resulting from oxygen vacancies or similar structures present in tungsten oxide. This means that adherents, which are likely to cause increase of the drive voltage and decrease of the life of the organic EL element 10, are removed without impairing the hole injection ability. Consequently, the hole injection efficiency for injecting holes from the hole injection layer 4 to the buffer layer 13 is improved, so that excellent characteristics of the organic EL element is realized.

(5) Wavelength of Ultraviolet Light

According to the present embodiment, after the hole injection layer 4 is formed, adherents on the hole injection layer 4 are removed by radiating ultraviolet light of a predetermined wavelength with respect to the hole injection layer 4 in the atmosphere. An organic EL element 10 having the hole injection layer 4 having been subjected to the adherents removal operates on a lower drive voltage than an organic EL element manufactured without removal of adherents. The predetermined wavelength of ultraviolet light was determined through the following observations.

First, the wavelength of ultraviolet light for generating ozone ($O_3$) in a gas atmosphere, such as the atmosphere, containing oxygen molecules ($O_2$) is 184.9 nm. By the following reaction taking place, an oxygen molecules is decomposed by ultraviolet light at 184.9 nm, whereby oxygen radicals (O) are generated. The oxygen radicals so generated then combine with another oxygen molecule to generate ozone.

In addition, the wavelength of ultraviolet light causing ozone to be decomposed and oxygen radicals to be generated once again is 253.7 nm.

In UV ozone cleaning, ultraviolet light at 184.9 nm and 253.7 nm is employed to generate oxygen radicals, and their strong oxidation effect is used to remove adherents. Therefore, as observed in the experiment where the hole injection layer 4 was subjected to UV ozone cleaning, there is a risk of the energy level resulting from oxygen vacancies or similar structures disappearing almost completely when ultraviolet light having such wavelengths are used.

In view of the above risk, the present embodiment uses ultraviolet light in a wavelength region of 184.9 nm or longer as such ultraviolet light is not likely to cause decomposition of oxygen molecules to yield oxygen radicals. In addition, in order so as to avoid oxygen radicals from being generated by decomposition of ozone present at an extremely small amount in the atmosphere, for example, ultraviolet light within a wavelength region of 253.7 nm or longer may be used.

Figure 19:
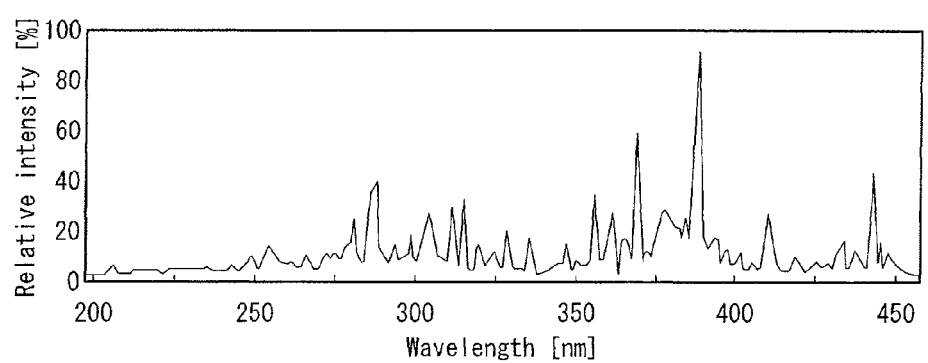
FIG. 19 illustrates a spectral distribution of a metal halide lamp pertaining to an embodiment.

The metal halide lamp actually used in the present embodiment has a spectral distribution as illustrated in FIG. 19. As illustrated in the figure, the present embodiment uses a lamp that emits light not including wavelengths of 253.7 nm or shorter as much as possible. In specific, in the light emitted by the metal halide lamp, the intensity of wavelengths of 253.7 nm or shorter is suppressed to be, at most, a few percents of the maximum intensity (at about 380 nm) of the metal halide lamp.

Next, inter-atom binding energies between different combinations of atoms in typical adherents are shown in Table 4. In the table, the mark "=" indicates a double bond, whereas the mark "–" indicates a single bond. To remove adherents, first, it is desirable to irradiate the layer surface with light having energy stronger than the inter-atom bonding energies to break the bonds between the atoms.

TABLE 4

| Binding | Binding Energy (kJ/mol) |
|---|---|
| C=C | 607 |
| C—C | 348 |
| C=O | 724 |
| C—O | 352 |
| C—H | 413 |
| O=O | 490 |
| O—O | 139 |
| O—H | 463 |

Note that the relation between a light energy E per mol of photons and a wavelength λ is expressed as an inverse proportion shown below.

E=Nhc/λ (N: Avogadro's number, h: Planck's constant, c: velocity of light, λ: wavelength)

From the above expression, the energy of ultraviolet light having a wavelength of 184.9 nm is calculated to be 647 kJ/mol. Similarly, the energy of ultraviolet light having a wavelength of 253.7 nm is calculated to be 472 kJ/mol. With reference to Table 4, the energy value of the ultraviolet light in the wavelength region determined according to the present embodiment is sufficient to disconnect most of the atomic bonds appearing in typical adherents. Especially, as will be later described in detail, in the case of chemical adsorption, adherents mainly form single bonds with oxygen atoms present in tungsten oxide. The strongest of the single bonds between oxygen atoms present in tungsten oxide and atoms present in the adherents is an O—H bond, with a bonding energy of about 463 kJ/mol (corresponding to a wavelength of 258 nm). Therefore, the ultraviolet light within the wavelength region of the present embodiment is strong enough to break this chemical bond. In addition, in the case of physical adsorption, the bonding is far weaker than chemical adsorption. As such, adherents are readily removed by UV irradiation.

The above describes the reason why the ultraviolet light used in the present embodiment can be utilized to remove adherents.

Indeed, the efficiency of adherent removal by the UV radiation according to the present embodiment is essentially lower than that of UV ozone cleaning. This is because, when UV ozone cleaning is performed, unbounded adherents formed as a result of the UV ozone cleaning are immediately oxidized with oxygen radicals to form molecules such as $CO_2$ and $H_2O$, which easily migrate. As has been already described, however, UV ozone cleaning is not suitable for cleaning the hole injection layer 4 composed of tungsten oxide.

To be noted next is that, generally, atomic bonds in tungsten oxide are not broken by the energy of ultraviolet light within the wavelength region according to the present embodiment. According to Non-Patent Literature 3, for example, the binding energy between an oxygen atom and a tungsten atom in tungsten oxide is 672 kJ/mol (corresponding to a wavelength of 178 nm). That is, it is difficult to break the bond between an oxygen atom and a tungsten atom with ultraviolet light within the wavelength region according to the present embodiment. This greatly differs from the above-described sputter etching performed in a vacuum by using argon ion. With the use of ultraviolet light according to the present embodiment, adherents are removed without breaking atomic bonds present in the hole injection layer 4 composed of tungsten oxide. More specifically, adherents are removed without making the hole injection layer 4 chemically active, or that is, while maintaining the hole injection layer 4 in a chemically-stable state.

For the reasons described above, ultraviolet light having a wavelength of 184.9 nm or longer, or more desirably, 253.7 nm or longer is used in the present disclosure. Note that visible light is generally incapable of breaking bonds formed by chemical adsorption. The present embodiment therefore uses ultraviolet light (380 nm or shorter), rather than visible light.

(6) Reason Why Energy Level Favorably Affecting Hole Injection Ability is Maintained Even After UV Irradiation According to the present embodiment, the energy level resulting from oxygen vacancies or similar structures on the layer surface of the hole injection layer 4 is continuously maintained even after UV irradiation and thus the hole injection ability of the hole injection layer 4 is maintained with stability. That is, the present embodiment ensures stable manufacturing of an organic EL element which operates on low drive voltage. This property of maintaining the energy level is considered below.

It has been frequently reported, with reference to results of experiments and first principles calculations, that existence of the energy level which can be seen in thin films and crystals of tungsten oxide derives from oxygen vacancies or similar structures present in tungsten oxide. More specifically, assumption has been made that the existence of the energy level derives from a binding orbital formed by 5d orbitals of adjacent tungsten atoms due to oxygen atom vacancy or from a 5d orbital of a singular tungsten atom which is not terminated with an oxygen atom and which exists at the surface of a film or within a film.

Here, it may be assumed that a 5d orbital of a tungsten atom is more stable when adherents are chemically adsorbed thereto, as compared with the case where the 5d orbital is present as a binding orbital or as a 5d orbital of a singular tungsten atom. However, such an assumption is not necessarily correct. Actually, as observed in the UPS spectra illustrated in FIG. 11 in the present embodiment, tungsten oxide left exposed in the atmosphere for two day exhibits a spectral protrusion near the Fermi surface, which corresponds to the energy level being discussed.

Figure 20:
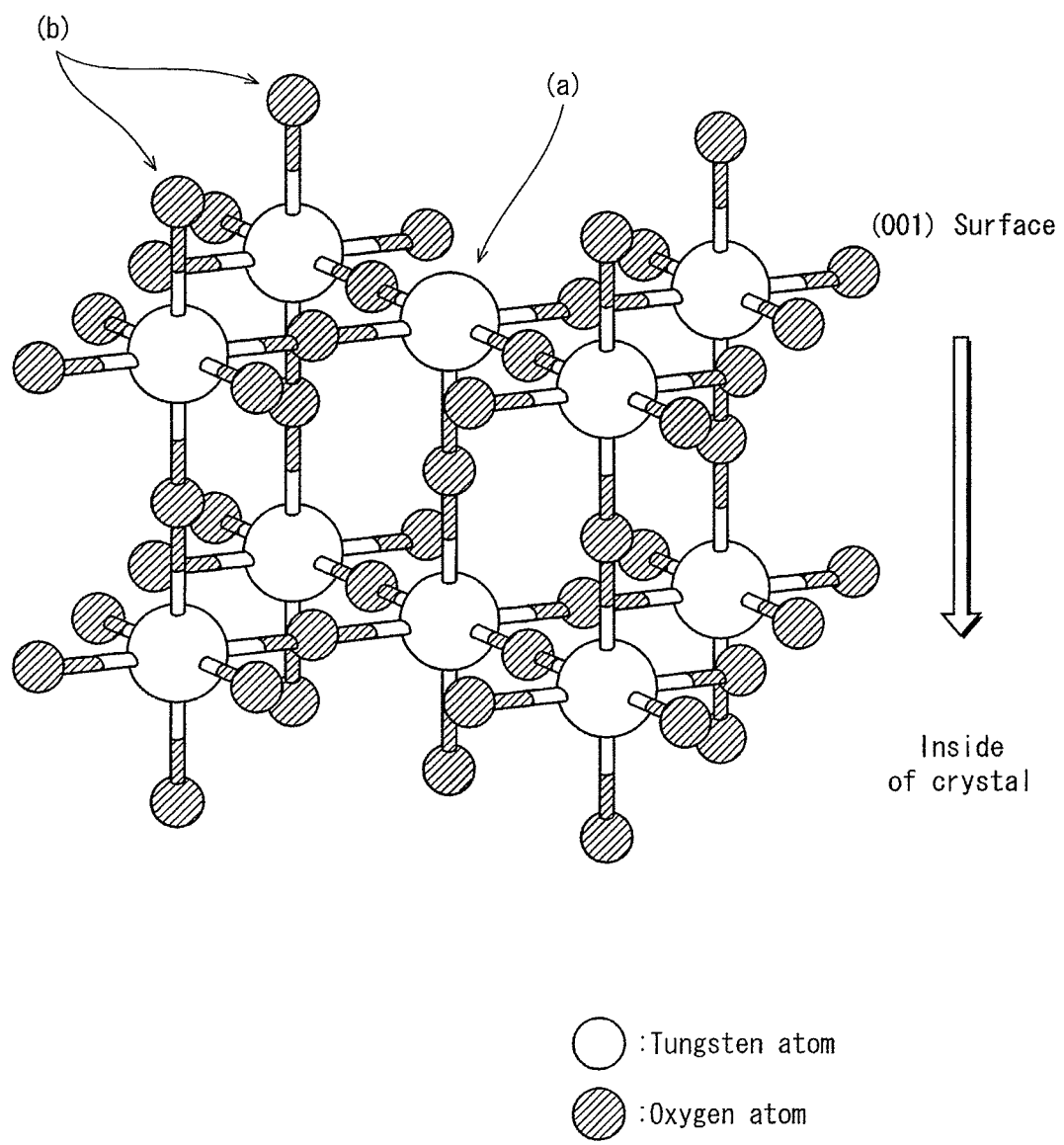
FIG. 20 illustrates a surface structure of tungsten oxide.

In Non-Patent Literature 4, it has been reported that when a tungsten trioxide single crystal is cleaved in a vacuum to expose a clean (001) surface, part of oxygen atoms present on the outermost surface are emitted into the vacuum. Non-Patent Literature 4 further reports the following reason, which has been confirmed by the first principles calculations, for which the (001) surface is more stable in terms of energy when a tungsten atom (a) not terminated with an oxygen atom is periodically present on the outermost surface as shown in FIG. 20 than when all the tungsten atoms are terminated with an oxygen atom. That is, when all the tungsten atoms present on the outermost surface are terminated with an oxygen atom, the electrical repulsive force occurring between terminal oxygen atoms becomes large, which leads to instability. In short, the (001) surface is more stable when oxygen vacancies or similar structures (a) are present on the surface thereof.

FIG. 20 illustrates tungsten oxide atoms each surrounded by six oxygen atoms to form an octahedron with the six oxygen atoms at the vertices. For the sake of simplicity, in the figure, the octahedrons are arranged in orderly succession in a manner similar to the rhenium oxide structure. In practice, however, the octahedrons are distorted to some extent and arranged without such orderliness.

By analogy with the above findings, the following mechanism may be one example of the reason for which the energy level resulting from oxygen vacancies or similar structures is maintained on the surface of the hole injection layer 4 continuously after the UV irradiation according to the present embodiment.

According to the present embodiment, the hole injection layer 4 composed of tungsten oxide is assumed to have a (001) facet at least locally on the layer surface immediately after the formation of the hole injection layer 4. That is, as illustrated in FIG. 20, the hole injection layer 4 is assumed to have terminal oxygen atoms (b) and tungsten atoms not terminated with an oxygen atom (a). Non-terminated tungsten atoms (a) are surrounded by terminal oxygen atoms (b). This is because the (001) surface has a stable structure. It is this surface that is exposed to impurity molecules and atomic molecules in the chamber of the sputtering film-forming apparatus subsequent to the formation of the hole injection layer 4.

In general, if unsaturated metal atoms such as (a) are present on a surface of a metal oxide, the metal atoms tend to be terminated with water molecules or organic molecules as a result of chemical adsorption. In the present embodiment, however, none of the W4f spectra illustrated in FIG. 15 have a peak in a binding energy range from 31 eV to 33 eV, at which a peak deriving from bonding between a tungsten atom and a carbon atom should appear. Instead, each W4f spectrum illustrated in FIG. 15 only exhibits a peak deriving from the bonding between a tungsten atom and an oxygen atom. It is therefore highly likely that the atoms of adsorbed molecules to which tungsten atoms (a) are chemically bonded is oxygen atoms.

However, for example, a tungsten atom (a) may chemically react with a water molecule to form a hydroxyl group or a tungsten atom (a) may chemically react with an organic molecule to be bonded to an oxygen atom contained in the organic molecule. In such cases, a repulsive force is generated between an adsorbed oxygen atom, which generally is negatively charged, and adjacent terminal oxygen atoms (a), which are also negatively charged. In view of the above, it is expected that adsorption of molecules to tungsten atoms (a) is relatively unlikely, for the same reason for which tungsten atoms (a) are unlikely to have terminal oxygen atoms in a vacuum.

On the other hand, terminal oxygen atoms (b) surrounding tungsten atoms (a) undergo addition reaction with water molecules and organic molecules to cause chemical adsorption. Such chemical adsorption occurs relatively easily as there is substantially no factor inhibiting the adsorption, such as repulsive force. In some cases, the chemical adsorption to terminal oxygen atoms (b) may result in that terminals of organic molecules composed of a few or more atoms are present in the immediate vicinity of tungsten atoms (a). Such organic molecules act as spatial barriers against the adsorption of molecules. Therefore, adsorption of molecules to terminal oxygen atoms (b) is also expected to prevent adsorption of molecules to tungsten atoms (a).

From the above consideration, in the layer surface having: terminal oxygen atoms (b); and unterminated tungsten atoms (a) surrounded by the terminal oxygen atoms (b), as illustrated in FIG. 20, chemical adsorption to the tungsten atoms (a) is unlikely to take place. Instead, impurity molecules and gas molecules in the atmosphere tend to chemically adhere to the terminal oxygen atoms (b) surrounding the tungsten atoms (a). Note that the chemical adsorption occurring in this case is a bond via a terminal oxygen atom and thus is a single bond in general.

Further, when UV irradiation is performed according to the present embodiment, only molecules chemically bonded to oxygen atoms (b) are disconnected and released. As a result, it is assumed that the oxygen atoms (b) revert to terminal oxygen atoms as they were before the chemical adsorption or react with water molecules to form hydroxyl groups, which are stable and not easily disconnected by UV irradiation according to the present embodiment.

To summarize the above, the hole injection layer 4 composed of tungsten oxide according to the present embodiment has, on the layer surface, a local structure as illustrated in FIG. 20. That is, tungsten atoms (a) not terminated with an oxygen atom are surrounded by terminal oxygen atoms (b). First of all, this structure per se has a characteristic which prevents adsorption of molecules to the tungsten atoms (a). In addition, molecules adhered to terminal oxygen atoms (b) are released by UV irradiation. After the UV irradiation, hydroxyl groups mainly remain present on the layer surface. Due to this, while adherents are removed by UV radiation performed after the formation of the hole injection layer 4, the electronic state resulting from oxygen vacancies or similar structures (a) on the layer surface of the hole injection layer 4 is maintained without being affected by the UV irradiation. The electronic state thus maintained positively affects the hole injection ability of the hole injection layer 4.

(7) Film Thickness Reduction of Hole Injection Layer

The present inventors have found that film thickness reduction of a hole injection layer containing tungsten oxide occurs during the manufacturing of an organic EL element including such a hole injection layer. Confronting such a situation, the present inventors made an assumption that this film thickness reduction of the hole injection layer takes place during the bank forming process. Based on such an assumption, the present inventors conducted a confirmation experiment as described in the following so as to investigate the cause of the film thickness reduction of the hole injection layer.

In the confirmation experiment, various samples were prepared according to the following procedures, and measurement of a film density and a film thickness reduction amount of each sample was performed. As for the specific method according to which the confirmation experiment was conducted, the inventors prepared each of sample devices A through C as described in the following. First, the present inventors formed a thin film composed of tungsten oxide, which is to become the hole injection layer, on a glass substrate by sputtering (the film forming conditions applied in forming the tungsten oxide films in the sample devices A through C were the same as the film forming conditions applied in the forming of the above-described hole-only devices 10A). Subsequently, the present inventors formed a resin material layer composed of a predetermined resin material ("TFR" series resin material produced by Tokyo Ohka Kogyo Co., Ltd.) on the hole injection layer by applying the spin coating method (room temperature, 2500 rpm/25 sec) and by performing baking (100° C., 90 sec). Following this, development processing (where a solution including 2.38% TMAH was used and where the developing time was 60 sec) and cleaning processing (where pure water was used and where the cleaning time was 60 sec) were performed. The forming of the resin material layer, the development processing, and the cleaning processing were performed so as to simulate bank forming processing performed when an organic EL element is actually manufactured.

Table 5 illustrates conditions applied for preparing each of the samples and the results of the measurement of the film density and the film thickness reduction amount of each of the samples. As indicated in Table 5, it was confirmed that film thickness reduction of the hole injection layer had taken place in each of the samples. For instance, in the case of the sample a, the film thickness of the hole injection layer was 80 nm immediately following the formation thereof, but in the end, the film thickness of the hole injection layer decreased to 23 nm. As such, it was observed that the film thickness of the tungsten oxide layer in sample a decreased by as much as approximately 57 nm due to occurrence of the film thickness reduction

TABLE 5

| | Sample | | |
|---|---|---|---|
| | Sample a | Sample b | Sample c |
| Total Pressure (Pa) | 4.8 | 2.7 | 2.7 |
| Ar:$O_2$ | 100:100 | 43:100 | 43:100 |
| Input Power (W) | 250 | 500 | 1000 |
| Film Density (g/cm$^3$) | 5.43 | 6.09 | 6.33 |
| Film Thickness Reduction Amount (nm) | 57.7 | 25 | 20.9 |
| Remarks/Film Forming Device | SMD | SOLCIET | SOLCIET |

In addition, as a result of investigation performed by the present inventors, it has been found that the film thickness reduction of a hole injection layer takes place as a result of the hole injection layer dissolving to a dissolution liquid used in the development processing or a dissolution liquid used in the cleaning processing. As description has been provided above, a film density of a hole injection layer is relatively low when the hole injection layer has a structure deriving from oxygen vacancies. It can be assumed that this is due to a great amount of minute crystalline structures being formed within a hole injection layer having the above-described structure deriving from oxygen vacancies. Further, it is assumed that, when a great amount of minute crystalline structures are formed in a hole injection layer as described above, a dissolution liquid (a developing solution, a cleaning liquid, etc.) used in the film forming process during the forming of banks readily permeates the hole injection layer, and thereby causes the film thickness reduction to take place.

Figure 21:
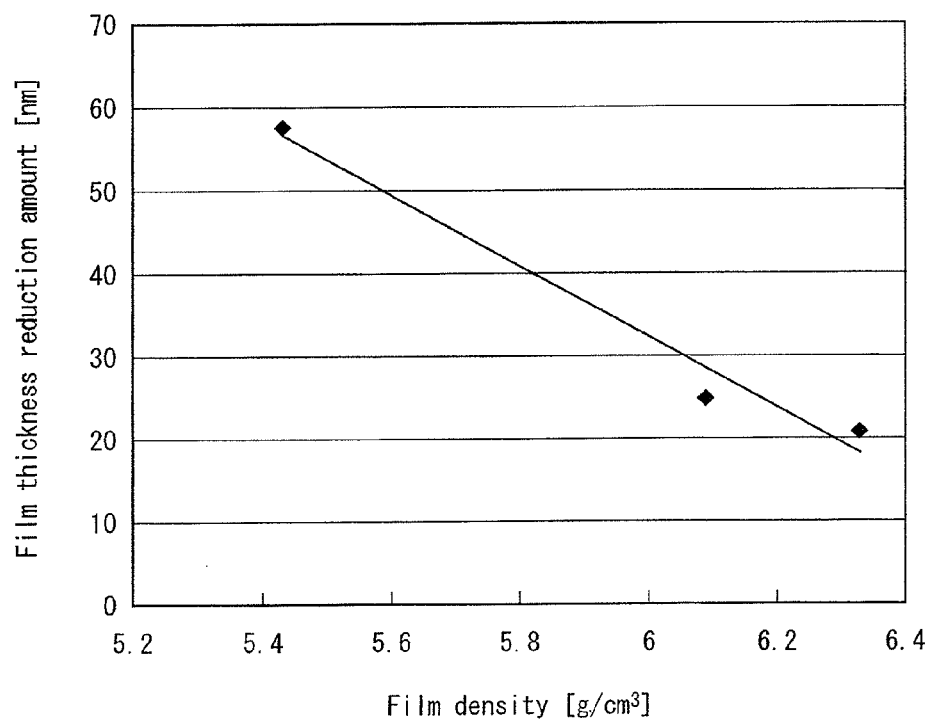
FIG. 21 is a graph illustrating a relation between a film thickness reduction amount and a film density of a tungsten oxide film.

FIG. 21 is a graph illustrating a relation between an amount of the hole injection layer decreasing as a result of the film thickness reduction (hereinafter referred to as a "film thickness reduction amount") and the film density of the hole injection layer. When analyzing the measurement results in Table 5, it can be seen that there is a considerable level of correlation between the film thickness reduction amount and the film density of the hole injection layer. More specifically, it can be seen that, when the hole injection layer has a relatively low film density, the film thickness reduction amount of the hole injection layer indicates a relatively great value. The present inventors, according to such analysis, have arrived at the assumption that, at the same time as the structure deriving from oxygen vacancies in the hole injection layer leads to excellent hole injection ability and enables an organic EL element including the hole injection layer to be driven at a low voltage, the same structure increases the likelihood of a dissolution liquid (a developing solution, a cleaning liquid, etc.) used in the film forming process during the forming of banks permeating the hole injection layer and thereby leads to an increase in the film thickness reduction amount of the hole injection layer.

Generally speaking, it can be considered that the occurrence of the film thickness reduction of a tungsten oxide film as described above leads to difficulty in the management of the film thickness of the tungsten oxide film, and further, leads to a risk of the hole injection characteristics of the hole injection layer, upon completion of an organic EL element including the hole injection layer, being affected in some way. As such, it can be assumed that, if a person skilled in the art should recognize the problem of the film thickness reduction of the hole injection layer as described above, the person skilled in the art would hesitate to use tungsten oxide for forming the hole injection layer.

However, the present inventors, though much devotion and consideration, have found that the film thickness reduction amount of a tungsten oxide film can be adjusted, for example, by changing the conditions according to which developing is performed (reducing the concentration of a developing solution to be used in the developing from 2.38% to around 0.2%) or by making appropriate changes to the conditions under which baking is performed. By making such changes, the thickness of a tungsten oxide film can be controlled while taking into consideration the occurrence of the film thickness reduction. As such, the present inventors conducted further consideration concerning how a sample of an organic EL element having a higher level of practicability can be manufactured while relying upon the above-described technology pertaining to the adjustment of the film thickness reduction amount of a hole injection layer, and as a result, have confirmed the technical matters as presented in the following.

As the first step in manufacturing a sample of an organic EL element having a higher level of practicability, the present inventors formed a hole injection layer including tungsten oxide on an anode. Subsequently, the present inventors disposed a bank material layer so as to be layered on the hole injection layer, and then, performed patterning with respect to the bank material layer so as to provide the bank material layer with a predetermined shape including an opening for forming a functional layer (at this point, exposure, development, and cleaning are each performed). Subsequently, the present inventors formed a functional layer at a position corresponding to the opening, and further, formed a cathode on the functional layer.

When analyzing the structure of the sample organic EL element manufactured in accordance with the above-described method, the present inventors found that, at a region of the hole injection layer corresponding to the above-described opening, a depression was formed by dissolution of tungsten oxide. Due to such a depression being formed, the hole injection layer, as a whole, was formed so as to have a recessed structure.

Based on this finding and by focusing on a recessed portion of the hole injection layer, which is surrounded by an inner bottom surface and an inner side surface, the present inventors arrived at the conception that, by applying ink material for forming the functional layer to an entire inner surface of the recessed portion, the wettability of the functional layer can be enhanced, which results in the functional layer being formed so as to have excellent characteristics.

As such, the present inventors arrived at a structure of an organic EL element where, within an area of the hole injection layer defined by banks, a surface of the hole injection layer facing the functional layer has a recessed structure, and further, the recessed structure has a recessed portion whose inner surface is in contact with the functional layer, as description has been provided in embodiment 1.

Embodiment 2

An organic EL element pertaining to embodiment 2 differs greatly from the organic EL element 10 pertaining to embodiment 1 in that the ITO layer is not fainted under the hole injection layer and that a protection film is formed on the hole injection layer. In the following, description is provided while focusing on aspects differing from embodiment 1 and while simplifying or omitting description concerning aspects that are similar to embodiment 1.

<Structure of Organic EL Element>

Figure 22:
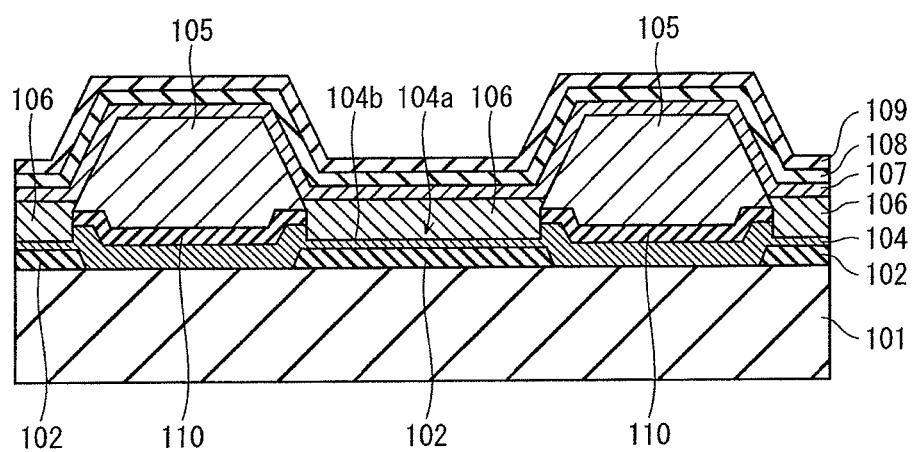
FIG. 22 is a schematic view illustrating a layered state of layers of an organic EL element pertaining to embodiment 2.

FIG. 22 is a schematic view illustrating a layered state of layers of the organic EL element pertaining to embodiment 2. As illustrated in FIG. 22, the light-emitting element pertaining to embodiment 2 includes an anode 102 formed on a substrate 101, and a hole injection layer 104 and a protective layer 110 that are layered on the anode 102 in the stated order. The hole injection layer 104 functions as a charge injection transport layer. Here, note that the hole injection layer 104 is formed across the entirety of an upper surface of the substrate 101 while the protective layer 110 is not formed above the anode 102. In addition, an ITO layer is not interposed between the anode 102 and the hole injection layer 104.

On the hole injection layer 104, banks 105 defining pixels are formed. Further, within a region defined by the banks 105, a light-emitting layer 106 is layered on the hole injection layer 104, and on the light-emitting layer 106, an electron injection layer 107, a cathode 108, and a sealing layer 109 are formed so as to extend over the regions defined by the banks 105 to be continuous between adjacent pixels.

<Manufacturing Method of Organic EL Element>

Figure 23A:
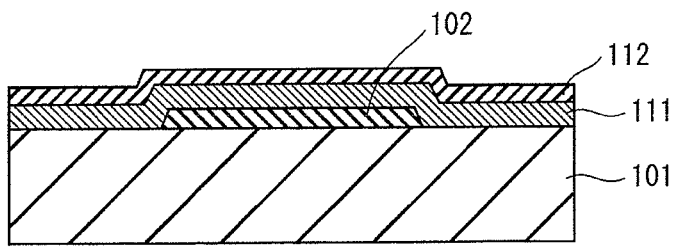
FIGS. 23A-23D each illustrate a step in a manufacturing method of the organic EL element pertaining to embodiment 2.

FIGS. 23A-23D each illustrate a step in a manufacturing method of the organic EL element pertaining to embodiment 2. In the manufacturing steps of the organic EL element pertaining to embodiment 2, as illustrated in FIG. 23A, first, on the substrate 101 that is made of glass, the anode 102 is formed with an aluminum-based (Al) material. Next, a thin film 111 made of tungsten oxide, which is to become the hole injection layer 104, is formed on the anode 102. Then a thin film 112 made of tungsten oxide, which is to become the protective layer 110, is formed on the thin film 111. The thin film 112 protects the hole injection layer 104 during etching for forming the banks 105.

Figure 23B:
Figure 23B:
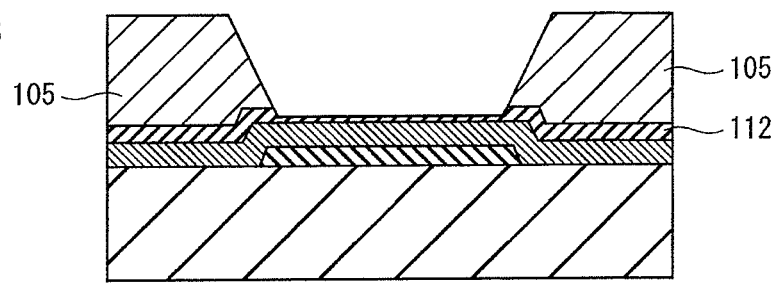

Subsequently, as illustrated in FIG. 23B, the banks 105 are formed on the thin film 112. In specific, a resist film containing resist material is formed on the thin film 112, and further, a resist pattern is formed on the resist film. Subsequently, desired portions of the resist film are removed by etching utilizing a developing solution. Accordingly, the pattern of the banks 105 is formed. Impurities such as hydrofluoric acid remaining on surfaces of the banks 105 after formation thereof are cleaned and removed by using a cleaning liquid such as pure water. However, it should be noted that a region of an upper surface of the thin film 112 defined by the banks 105 dissolves due to the cleaning liquid and thereby drops lower in level.

Figure 23C:
Figure 23C:
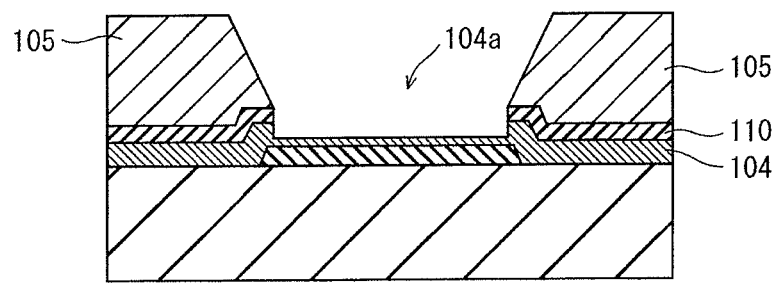
Figure 23D:
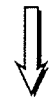
Figure 23D:
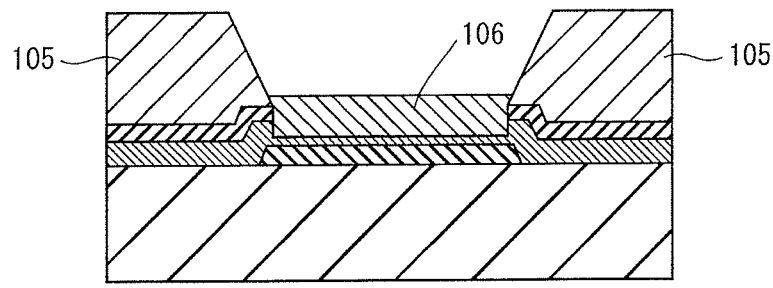

When the processing using the cleaning liquid is continued further, the region of the thin film 112 defined by the banks 105 dissolves completely until the protective layer 110 is formed as illustrated in FIG. 23C. In addition, since the thin film 111 is exposed to the outside due to the thin film 112 having dissolved, a region of an upper surface of the thin film 111 defined by the banks 105 dissolves and thereby drops lower in level. Hence, the recessed portion 104a is formed. The hole injection layer 104 is formed in such a manner.

Subsequently, the light-emitting layer 106 is formed on the hole injection layer 104 within a region defined by the banks 105. Description on the procedures following this point is omitted since the procedures following this point are similar to the corresponding procedures in embodiment 1.

Embodiment 3

An organic EL element pertaining to embodiment 3 differs greatly from the organic EL element pertaining to embodiment 2 in terms of the region at which the hole injection layer is formed. In the following, description is provided while focusing on aspects differing from embodiment 2 and while simplifying or omitting description concerning aspects that are similar to embodiment 2.

<Structure of Organic EL Element>

Figure 24:
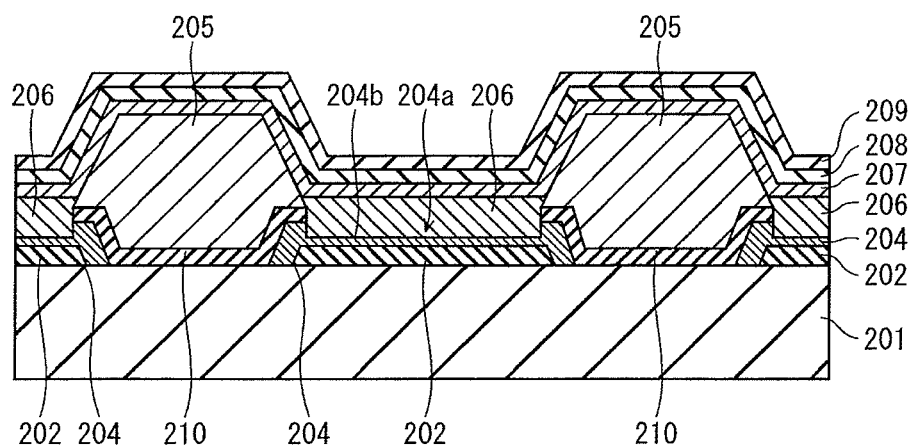
FIG. 24 is a schematic view illustrating a layered state of layers of an organic EL element pertaining to embodiment 3.

FIG. 24 is a schematic view illustrating a layered state of layers of the organic EL element pertaining to embodiment 3. As illustrated in FIG. 24, the organic EL element pertaining to embodiment 3 includes an anode 202 formed on a substrate 201, and a hole injection layer 204 and a protective layer 210 that are layered on the anode 202 in the stated order. The hole injection layer 204 functions as a charge injection transport layer. Note that the hole injection layer 204 is not formed across the entirety of an upper surface of the substrate 1 but formed only on the anode 202 and at regions around the anode 202. On the other hand, the protective layer 210 is not formed above the anode 202.

On the hole injection layer 204, banks 205 defining pixels are formed. Further, within a region defined by the banks 205, a light-emitting layer 206 is layered on the hole injection layer 204, and on the light-emitting layer 206, an electron injection layer 207, a cathode 208, and a sealing layer 209 are formed so as to extend over the regions defined by the banks 205 to be continuous between adjacent pixels.

<Manufacturing Method of Organic EL Element>

Figure 25A:
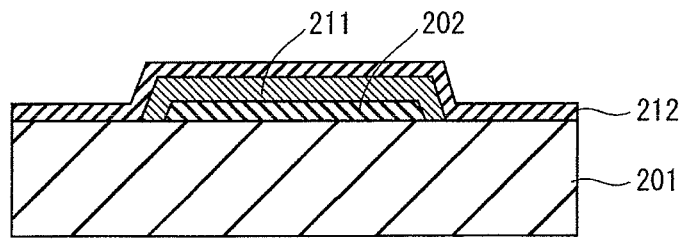
FIGS. 25A-25D each illustrate a step in a manufacturing method of the organic EL element pertaining to embodiment 3.

FIGS. 25A-25D each illustrate a step in a manufacturing method of the organic EL element pertaining to embodiment 3. In the manufacturing steps of the organic EL element pertaining to embodiment 3, as illustrated in FIG. 25A, first, on the substrate 101 that is made of glass, the anode 202 is formed with an aluminum-based (Al) material. Next, an oxide film 211, which is to become the hole injection layer 204, is formed by oxidizing an exposed surface (upper and side surfaces) of the anode 202. Then a thin film 212 made of tungsten, which is to become the protective layer 210, is formed on the oxide film 211.

Figure 25B:
Figure 25B:
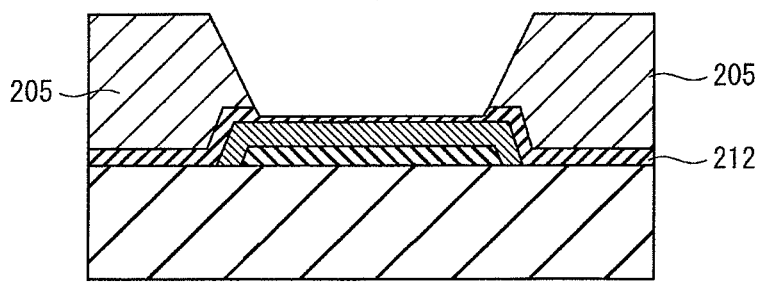

Subsequently, as illustrated in FIG. 25B, the banks 205 are formed on the thin film 212. Impurities such as hydrofluoric acid remaining on surfaces of the banks 205 after formation thereof are cleaned and removed by using a cleaning liquid such as pure water. However, it should be noted that a region of an upper surface of the thin film 212 defined by the banks 205 dissolves due to the cleaning liquid and thereby drops lower in level.

Figure 25C:
Figure 25C:
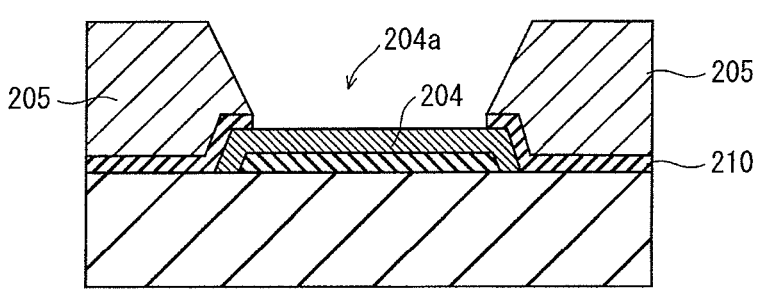

When the processing using the cleaning liquid is continued further, the region of the thin film 212 defined by the banks 205 dissolves completely and the thin film 212 is put in a final form thereof, which is the protective layer 210, as illustrated in FIG. 25C. In addition, since a region of an upper surface of the thin film 211 defined by the banks 205 is exposed to the outside due to the thin film 212 having dissolved, the region of the upper surface of the thin film 211 defined by the banks 205 dissolves and thereby drops lower in level. Hence, the recessed portion 204a is formed. The hole injection layer 204 is formed in such a manner.

Figure 25D:
Figure 25D:
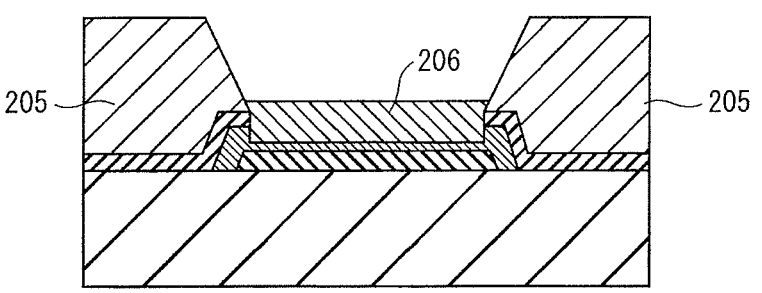

Subsequently, the light-emitting layer 206 is formed on the hole injection layer 204 within a region defined by the banks 205, as illustrated in FIG. 25D. Description on the procedures following this point is omitted since the procedures following this point are similar to the corresponding procedures in embodiment 2.

Embodiment 4

Figure 26:
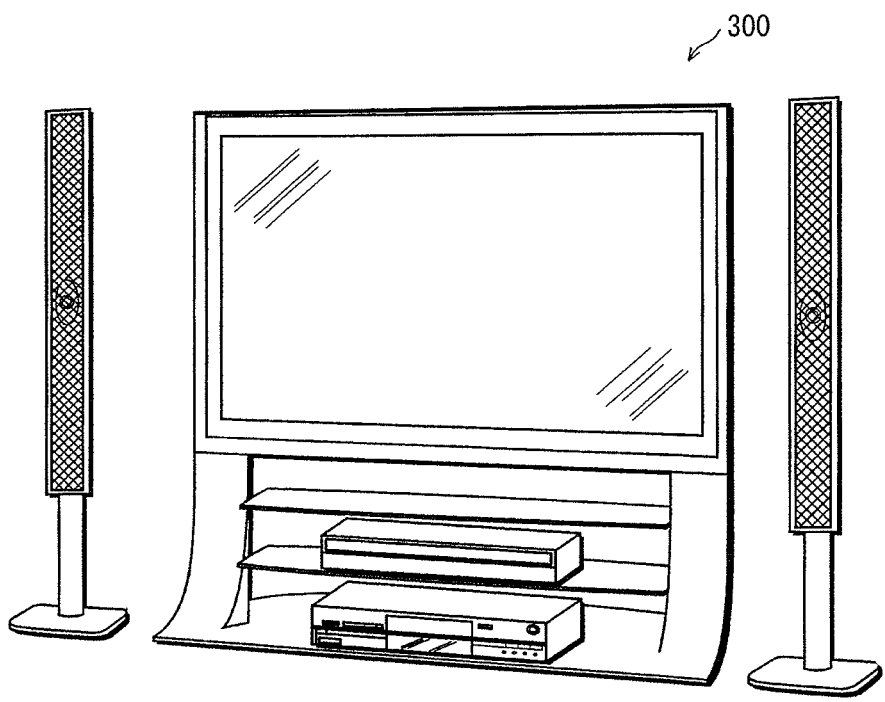

FIG. 26 is a perspective view illustrating a display apparatus pertaining to embodiment 4 and the like. As illustrated in FIG. 26, a display apparatus 300 pertaining to one aspect of the present invention is an organic EL display formed by a plurality of pixels arranged in a matrix extending in both the row direction and the column direction. Each pixel emits light of a corresponding color among the colors of R, G, and B and is composed of the light-emitting element pertaining to one aspect of the present invention.

Figure 27:
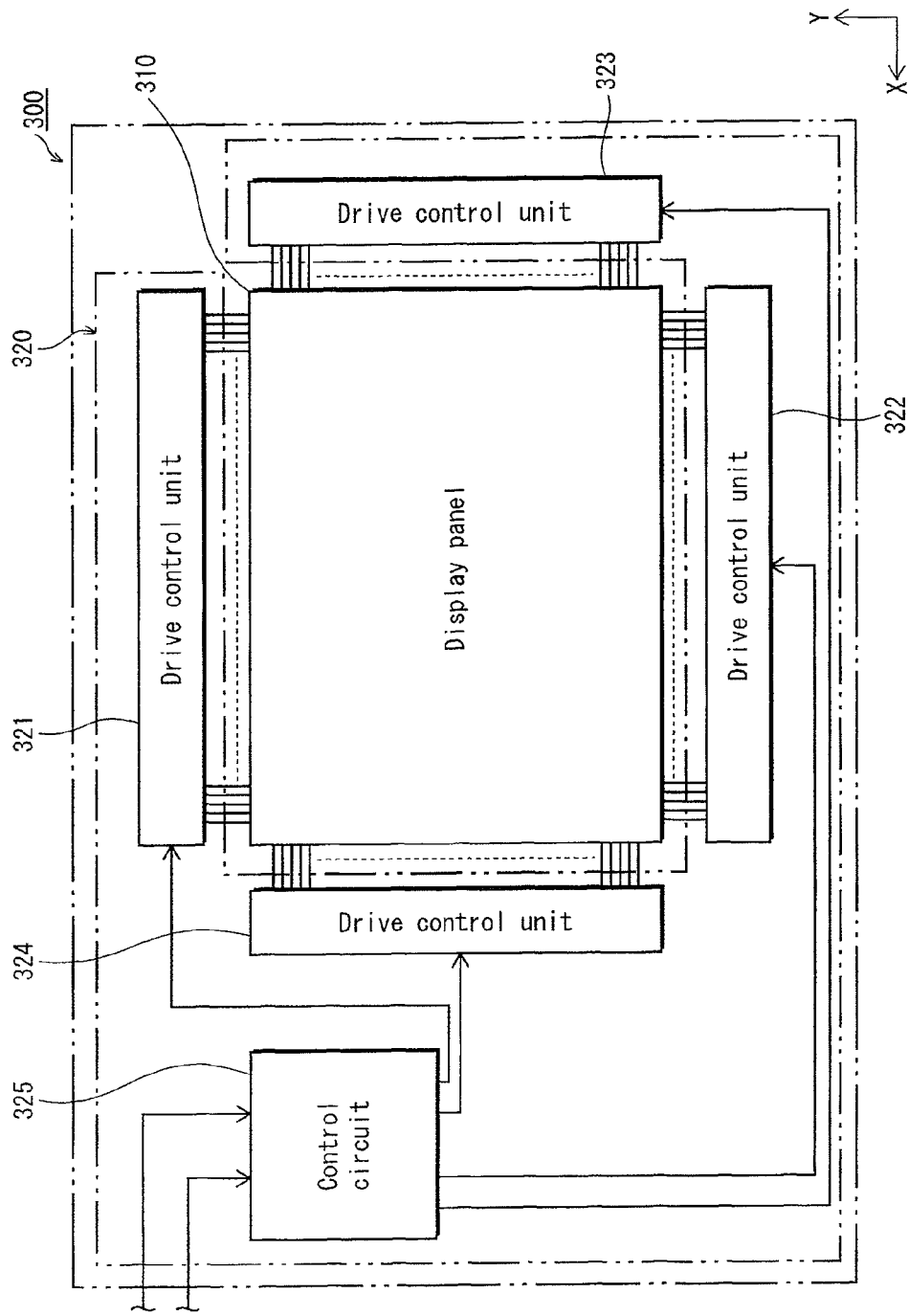
FIG. 27 is a perspective view illustrating an overall structure of the display apparatus pertaining to embodiment 4.

FIG. 27 is a perspective view illustrating an overall structure of the display apparatus pertaining to embodiment 4. As illustrated in FIG. 27, the display apparatus 300 includes a display panel 310 having organic EL elements manufactured by the method according to one aspect of the present invention and also includes a drive control unit 320 connected to the display panel 310. The display apparatus 300 may be used, for example, in a display, a television, a mobile phone, etc. The drive control unit 320 includes four drive circuits 321-324 and a control circuit 325. However, in an actual display apparatus 300, the arrangement and connection of the drive control unit 320 with respect to the display panel 310 is not limited to as described above.

The display apparatus 300 having the above structure is excellent in its image quality owing to the excellent light-emitting characteristics of the organic EL elements.

Embodiment 5

Figure 28A:
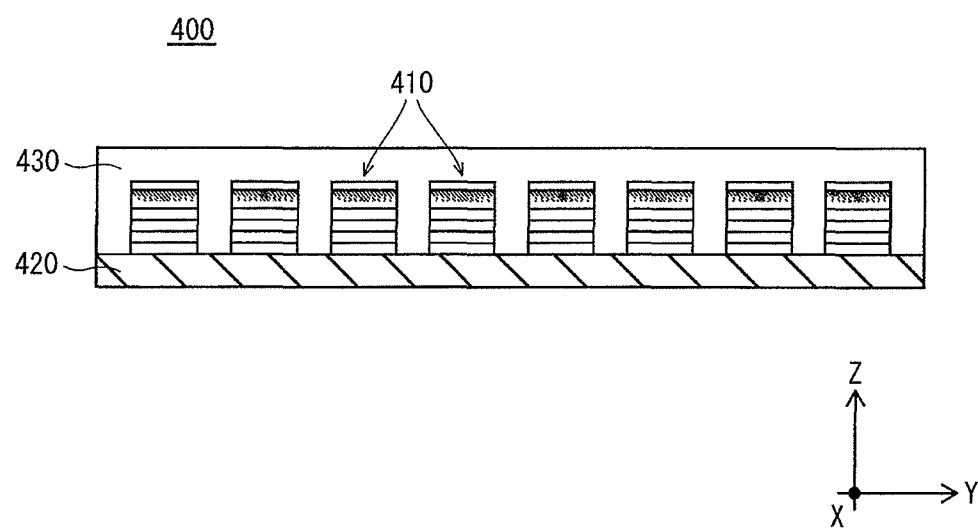
FIG. 28A is a longitudinal cross-sectional view illustrating a light-emitting apparatus pertaining to embodiment 5.
Figure 28B:
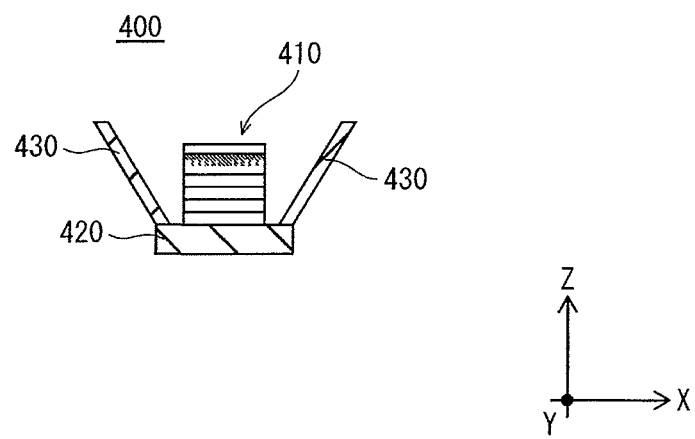
FIG. 28B is a transverse cross-sectional view illustrating the light-emitting apparatus pertaining to embodiment 5.

FIG. 28A is a longitudinal cross-sectional view illustrating a light-emitting apparatus pertaining to embodiment 5, and FIG. 28B is a transverse cross-sectional view illustrating the light-emitting apparatus pertaining to embodiment 5. As illustrated in FIGS. 28A and 28B, the light-emitting apparatus 400 includes: organic EL elements 410 manufactured according to the manufacturing method pertaining to one aspect of the present invention; a base 420 having the organic EL elements 410 mounted on its upper surface; and a pair of reflecting members 430 disposed to flank an array of the organic EL elements 410. The light-emitting apparatus 400 may be used as an illuminator and a light source. The organic EL elements 410 are electrically connected to a conductive pattern (undepicted) formed on the base 420 and emit light on drive power supplied via the conductive pattern. Part of light emitted from the organic EL elements 410 is reflected by the reflecting members 430, whereby the light distribution is controlled.

The light-emitting apparatus 400 having the above structure is excellent in its image quality owing to the excellent light-emitting characteristics of the organic EL elements.

[Modifications]

Up to this point, specific explanation has been provided of an organic EL element, a display apparatus, and a light-emitting apparatus, each of which pertaining to one aspect of the present invention, while referring to specific embodiments thereof. However, it should be noted that the above-described description provided in the embodiments merely provides exemplary embodiments of aspects of the present invention, and therefore, the present invention should not be construed as being limited to such embodiments. For example, the sizes and/or materials specifically mentioned are merely typical examples used to facilitate understanding of the present disclosure, and hence, the present disclosure is not limited to such specific sizes and/or materials.

The hole injection layer pertaining to one aspect of the present invention is not limited to being composed of tungsten oxide. That is, the hole injection layer suffices if tungsten oxide is contained therein. As such, the hole injection layer may be composed of, for instance, molybdenum tungsten oxide ($Mo_xW_yO_z$). In the composition formula ($Mo_xW_yO_z$) denoting the composition of molybdenum tungsten oxide, when $x+y=1$, $z$ is a real number existing within a range of approximately $2<z<3$. In addition, molybdenum tungsten oxide composing the hole injection layer may include a trace level of impurities, provided that the amount does not exceed the amount of impurities which may be incorporated as a result of normal processing. The same effects as described above yielded by a hole injection layer composed of tungsten oxide can be yielded by a hole injection layer composed of molybdenum tungsten oxide.

Further, the implementation of the organic EL element pertaining to one aspect of the present invention is not limited to a structure where the organic EL element is used in an independent state. That is, a plurality of the organic EL elements may be integrated on a substrate as pixels to form an organic EL panel. An organic EL display so yielded may be implemented by appropriately arranging the thickness of each of the layers in each of the organic EL elements.

When forming an organic EL panels using application-type organic EL elements, the integration of a plurality of the organic EL elements as pixels on a substrate is performed in the following manner, for example. That is, banks defining the pixels are formed on the hole injection layer composed of tungsten oxide, and further, a functional layer is overlaid within a region of the hole injection layer defined by the banks. Here, the bank forming processing is performed in the following manner, for example. First, a bank material composed of photosensitive resist material is applied onto the surface of the hole injection layer, followed by pre-baking of the bank material. Then, the bank material is exposed to light via a pattern mask to remove unhardened, redundant bank material with a developing solution, followed by rinsing with pure water. The invention as disclosed in the present disclosure is also applicable to a hole injection layer composed of tungsten oxide having undergone the bank forming processing as described above. In this case, by performing UV irradiation of the surface of the hole injection layer after the banks are formed, organic molecules, which are residuals of the banks and the developing solution, are mainly removed from the surface of the hole injection layer. In general, irradiating banks with ultraviolet light results in changes in the contact angle between the banks and an organic solvent applied to form an upper layer. However, according to the present disclosure, it is easy to uniquely determine specific irradiation for the irradiation of ultraviolet light. Therefore, the contact angle and the shapes of the banks can be appropriately adjusted in view of the irradiation conditions having been uniquely determined.

The organic EL element according to one aspect of the present invention may be a so-called bottom emission type organic EL element or a top emission type organic EL element.

In the manufacturing method of the organic EL element according to one aspect of the present invention, the UV irradiation is performed in the ambient atmosphere. Alternatively, however, the UV irradiation may be performed in various other gas atmospheres, such as a reduced-pressure atmosphere, an inert gas atmosphere, or a vacuum. The UV irradiation can be performed in various gas atmospheres as described above since the cleaning by UV irradiation utilizes ultraviolet light at such wavelengths not generating oxygen radicals. Still, however, it is beneficial that the UV irradiation be performed in the atmosphere particularly in the manufacturing of large-sized panels, for the reasons stated above.

INDUSTRIAL APPLICABILITY

The organic EL element manufactured according to the manufacturing method pertaining to the present disclosure is to be used as display elements for mobile phone displays and TVs, and as a light source for various applications. Regardless of the specific use thereof, the organic EL element pertaining to the present disclosure is applicable as an organic EL element having a wide range of luminous intensity from low luminous intensity to high luminous intensity for the use as a light source or the like, and which can be driven at a low voltage. The organic EL element pertaining to the present disclosure, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST 2 anode
4 hole injection layer
4a recessed portion
4b inner surface
5 banks
6 light-emitting layer 8 cathode
10 organic EL element
300 display apparatus
400 light-emitting apparatus

The invention claimed is:

1. An organic EL element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83, the hole injection layer has a surface facing the functional layer and has a recessed structure such that a portion of the surface overlapping with the light-emitting sublayer is located closer to the anode than other portions of the surface overlapping with the banks, the portion of the surface overlapping with the light-emitting sublayer and the other portions of the surface overlapping with the banks are located closer to the anode than a peripheral bottom surface of each of the banks, and the recessed structure comprises an inner surface that is in contact with the functional layer, the inner surface including an inner bottom surface and an inner side surface that is continuous with the inner bottom surface.

2. The organic EL element of claim 1, wherein
in the UPS spectrum, the protrusion appears within the region corresponding to the binding energy range from approximately 1.8 eV to approximately 3.6 eV lower than the top of the valance band.

3. The organic EL element of claim 1, wherein
the ratio in the number density of the other atoms to the tungsten atoms does not exceed approximately 0.62.

4. The organic EL element of claim 1, wherein
the atoms other than tungsten atoms and oxygen atoms comprise carbon atoms.

5. The organic EL element of claim 1, wherein
the hole injection layer is irradiated with ultraviolet light so that:
the hole injection layer, in the UPS spectrum obtained from the UPS measurement, has the protrusion appearing near the Fermi surface and within the region corresponding to the binding energy range lower than the top of a valence band; and
the tungsten oxide contained in the hole injection layer satisfies the condition, as determined by the XPS measurement, that the ratio in the number density of atoms other than tungsten atoms and oxygen atoms to the tungsten atoms does not exceed approximately 0.83.

6. The organic EL element of claim 1, wherein
the banks are liquid-repellent and the hole injection layer is liquid-philic.

7. An organic EL element, comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, an Ultraviolet Photoelectron Spectroscopy (UPS) spectrum, obtained from an UPS measurement, having: a protrusion appearing near a Fermi surface and within a region corresponding to a binding energy range lower than a top of a valence band, and a peak appearing within a region corresponding to a binding energy range from approximately 4.5 eV to approximately 5.4 eV, the hole injection layer has a surface facing the functional layer and has a recessed structure such that a portion of the surface overlapping with the light-emitting sublayer is located closer to the anode than other portions of the surface overlapping with the banks, the portion of the surface overlapping with the light-emitting sublayer and the other portions of the surface overlapping with the banks are located closer to the anode than a peripheral bottom surface of each of the banks, and the recessed structure comprises an inner surface that is in contact with the functional layer, the inner surface including an inner bottom surface and an inner side surface that is continuous with the inner bottom surface.

8. The organic EL element of claim 7, wherein
in the UPS spectrum, the protrusion appears within the region corresponding to the binding energy range from approximately 1.8 eV to approximately 3.6 eV lower than the top of the valance band.

9. The organic EL element of claim 7, wherein
the hole injection layer is irradiated with ultraviolet light so that:
the hole injection layer, in the UPS spectrum, obtained by the UPS measurement, has: the protrusion appearing near the Fermi surface and within the region corresponding to the binding energy range lower than the top of the valence band; and
the peak appears within the region corresponding to the binding energy range from approximately 4.5 eV to approximately 5.4 eV.

10. The organic EL element of claim 7, wherein
the banks are liquid-repellent and the hole injection layer is liquid-philic.

11. A display apparatus comprising an organic EL element according to claim 1.

12. A light-emitting apparatus comprising an organic EL element according to claim 1.

13. The organic EL element of claim 1, wherein
the surface of the hole injection layer which faces the functional layer and which includes the portion and the other portions is located closer to the anode in level than bottom surfaces of the banks.

14. The organic EL element of claim 1, wherein
a film thickness of the other portions of the hole injection layer is uniform.

15. The organic EL element of claim 1, wherein
a film thickness of the light-emitting layer is uniform.

16. The organic EL element of claim 1, wherein
the recess structure extends under the peripheral bottom surface of at least one of the banks.

17. The organic EL element of claim 7, wherein
the surface of the hole injection layer which faces the functional layer and which includes the portion and the other portions is located closer to the anode in level than bottom surfaces of the banks.

18. The organic EL element of claim 7, wherein
a film thickness of the other portions of the hole injection layer is substantially uniform.

19. The organic EL element of claim 7, wherein
a film thickness of the light-emitting layer is uniform.

20. The organic EL element of claim 7, wherein
the recess structure extends under the peripheral bottom
surface of at least one of the banks.

* * * * *